United States Patent
Shiga et al.

(10) Patent No.: US 7,372,744 B2
(45) Date of Patent: May 13, 2008

(54) MEMORY SYSTEM WHICH COPIES SUCCESSIVE PAGES, AND DATA COPY METHOD THEREFOR

(75) Inventors: Hitoshi Shiga, Yokohama (JP); Chih-Chung Chen, Jubei (TW); Chih-Hung Wang, Jubei (TW); Sheng-Lin Hung, Jubei (TW)

(73) Assignees: Kabushiki Kaisha Toshiba, Tokyo (JP); Solid State System Co., Ltd., Jubei (TW)

( * ) Notice: Subject to any disclaimer, the term of this patent is extended or adjusted under 35 U.S.C. 154(b) by 243 days.

(21) Appl. No.: 11/216,215

(22) Filed: Sep. 1, 2005

(65) Prior Publication Data
US 2006/0050314 A1 Mar. 9, 2006

(30) Foreign Application Priority Data
Sep. 3, 2004 (JP) ............................. 2004-257565

(51) Int. Cl.
*G11C 7/10* (2006.01)
(52) U.S. Cl. ........................ 365/189.05; 365/185.12; 365/185.17
(58) Field of Classification Search ........... 365/189.05, 365/230.08, 185.17, 185.11, 185.29, 185.12, 365/185.33
See application file for complete search history.

(56) References Cited

U.S. PATENT DOCUMENTS 6,507,508 B2* 1/2003 Hosono et al. ............... 365/63
6,868,007 B2* 3/2005 Hasegawa et al. ...... 365/185.09
7,085,160 B2* 8/2006 Shiga et al. ........... 365/185.17
7,161,850 B2* 1/2007 Shiga et al. ........... 365/189.05

FOREIGN PATENT DOCUMENTS

| JP | 2000-251484 | 9/2000 |
|---|---|---|
| JP | 2002-141477 | 5/2002 |

* cited by examiner

*Primary Examiner*—Richard T. Elms
*Assistant Examiner*—Hien N Nguyen
(74) *Attorney, Agent, or Firm*—Oblon, Spivak, McClelland, Maier & Neustadt, P.C.

(57) ABSTRACT

A memory system includes a memory cell array, a bit line switch, first and second page buffers, a column switch, an error correction circuit, and control circuits. The second page buffer can swap data with the first page buffer. The control circuits controls the bit line switch and the first and second page buffers, sequentially reads, page by page, one or more pages from the mth (m is a positive integer) page to the nth (n is an integer greater than m) page of the first block in the memory cell array, controls the error correction circuit to perform error correction calculation by the error correction circuit, controls the first and second data buffers and the bit line switch, and controls to perform write in the second block in the erase state in the memory cell array.

19 Claims, 14 Drawing Sheets

Threshold voltage of cell

MEMORY SYSTEM WHICH COPIES SUCCESSIVE PAGES, AND DATA COPY METHOD THEREFOR

CROSS-REFERENCE TO RELATED APPLICATIONS

This application is based upon and claims the benefit of priority from prior Japanese Patent Application No. 2004-257565, filed Sep. 3, 2004, the entire contents of which are incorporated herein by reference.

BACKGROUND OF THE INVENTION

1. Field of the Invention

The present invention relates to a memory system and data copy method therefor and, more particularly, to copying of successive pages in, e.g., a NAND flash memory, and is applied to system which performs error correction in copying.

2. Description of the Related Art

In a NAND flash memory, as disclosed in, e.g., Jpn. Pat. Appln. KOKAI Publication No. 2002-141477, a memory cell has an n-channel MOSFET structure in which, for example, a floating gate and control gate are stacked as a charge storage multilayer. A plurality of memory cells of this structure are series-connected to each other so that adjacent memory cells share sources and drains. One NAND string is formed by interposing first and second select gates respectively between a bit line and one terminal of the NAND string and between a source line and the other terminal. The NAND strings are arrayed, and the control gates of memory cells on the same row are commonly connected to a word line. The gates of the first select gates on the same row are commonly connected to the first select gate line, and those of the second select gates on the same row are commonly connected to the second select gate line.

A group of NAND strings which share the word line forms a block serving as an erase unit, and in an erase, data of all memory cells in the block are erased. In a read and write, one first select gate in a plurality of blocks is selected and rendered conductive to connect series-connected memory cells to a bit line. In this state, a selection voltage is applied to one word line, and a non-selection voltage is applied to the remaining word lines on the same NAND string. Each bit line is connected to a sense amplifier and a write bias circuit (to be referred to as a page buffer including a data buffer which holds read data and write data). A read and write are executed for pages which share a selected word line. One page is made up of, e.g., 2,112 bytes, and one block is made up of, e.g., 128 KB.

A host accesses data stored in a memory cell via an I/O bus. Assuming that the bit width of the I/O bus is, e.g., 8 bits (1 byte), the host accesses the page buffer byte by byte, similar to an SRAM.

In the NAND flash memory, even an unselected word line (control gate) is biased in a read or write by applying a high voltage, the disturbing characteristic is strict, and error correction is often required for a read. The size of the erase unit (block) is larger than that of the write unit (page), and when given page data is erased for overwrite, an entire block containing the page is erased. To prevent this, the remaining page data in the block must be backed up in another block before an erase. This results in frequent copying of successive pages (page copy) in the NAND flash memory.

The NAND flash memory performs sense operation for each page, and can easily implement a page copy function of directly writing read data in another page when a page copy is done without any error correction. If no error correction is performed for read data and the read data is erroneous, the erroneous data is directly written into a new page. In this case, repetitive page copying may generate many error bits which cannot be corrected by general error correction in a read.

In order to avoid generation of many error bits, a copy method is sometimes employed in which error correction is done for data read in a page copy, and if an error bit is detected, the data is corrected and then written at a new page address. At this time, a page copy consists of three sequences: reading a target page, error correction of read data, and writing to a write destination. Of these sequences, reading and writing require access to a memory cell, and error correction requires access not to a memory cell but to an error correction circuit. Reading and writing can be batch-processed for each page, but in error correction, data of a page buffer must be sequentially transferred to an ECC circuit 11 via a bus (e.g., 8 bits). For example, when the page size is 2,112 bytes and the bus width is 8 bits, 2,112 cycles of "data read+error calculation and update of corrected data" are necessary. For an access cycle of 50 ns, these cycles require about 100 μs (50 ns×2,112). Assuming that a read takes 25 μs and a write takes 200 μs, this page copy takes 1.5 times as long as for a page copy free from any error correction.

As described above, in the conventional memory system and the data copy method therefor, if no error correction is done in a read of a page subjected to page copying, repetitive page copying causes a data copy error, degrading the data reliability. Error correction for preventing the degradation makes page copying very slow.

BRIEF SUMMARY OF THE INVENTION

According to an aspect of the present invention, there is provided a memory system comprising a memory cell array in which electrically rewritable nonvolatile memory cells are arrayed, a first data buffer which holds, in read, data read from the memory cell array via a bit line switch and in write, data to be written in the memory cell array via the bit line switch, a second data buffer which is configured to swap data with the first data buffer, copies data to the first data buffer, and receives a copy of data from the first data buffer, a bus switch which is interposed between the second data buffer and a bus, selects part of data held by the second data buffer, and transfers the part of data to the bus, an error correction circuit which is connected to the bus and performs error correction calculation of data read from the memory cell array, and a control circuit which controls the bit line switch, the first data buffer, and the second data buffer, sequentially reads, page by page, at least one page from an mth (m is a positive integer) page to an nth (n is an integer greater than m) page of a first block in the memory cell array, controls the error correction circuit to perform error correction calculation by the error correction circuit, controls the first data buffer, the second data buffer, and the bit line switch, and controls to perform write in the second block in an erase state in the memory cell array.

According to another aspect of the present invention, there is provided a memory system comprising a memory cell array in which electrically rewritable nonvolatile memory cells are arrayed, a first data buffer and a second data buffer which hold, in read, data read from the memory cell array and in write, data to be written in the memory cell array, a bit line switch which connects one of the first data buffer and the second data buffer to the memory cell array, a bus switch which connects, to a bus, one of the first data buffer and the second data buffer that is not connected to the memory cell array, an error correction circuit which is connected to the bus and performs error correction calculation of data read from the memory cell array, and a control circuit which controls the bit line switch, the first data buffer, and the second data buffer, sequentially reads, page by page, at least one page from an mth (m is a positive integer) page to an nth (n is an integer greater than m) page of a first block in the memory cell array, controls the error correction circuit to perform error correction calculation by the error correction circuit, controls the first data buffer, the second data buffer, and the bit line switch, and controls to perform write in the second block in an erase state in the memory cell array.

According to still another aspect of the present invention, there is provided a page copy method for a memory system, comprising reading out, page by page, data of a plurality of pages at successive page addresses from a memory cell array to a first data buffer, swapping data read to the first data buffer with data of a second data buffer, executing error correction calculation for the readout data of the plurality of pages, correcting erroneous data detected by the error correction calculation, inputting, to the second data buffer, the data of the plurality of pages after correcting the erroneous data, swapping the data of the second data buffer with the data of the first data buffer, and writing the data of the first data buffer in an area different from an area of the memory cell array from which the data is read, wherein error correction calculation and correction operation for a page next to a given page subjected to read or write is performed during read or write of the given page.

According to still another aspect of the present invention, there is provided a data copy method for a memory system in which a plurality of pages are transferred and copied from a copy source block to a copy destination block in a flash memory having a memory cell array, a first page buffer, a second page buffer, and an error correction circuit, comprising storing first page data of the copy source block in the first page buffer, storing second page data of the copy source block in the second page buffer, starting a program procedure from the first page buffer and the second page buffer for the copy destination block of the memory cell array in order to program the first page data of the copy source block, and starting an ECC verify procedure in order to verify the second page data of the copy source block in the second page buffer, wherein the program procedure and the ECC verify procedure are simultaneously executed.

DETAILED DESCRIPTION OF THE INVENTION

FIRST EMBODIMENT

Figure 1:
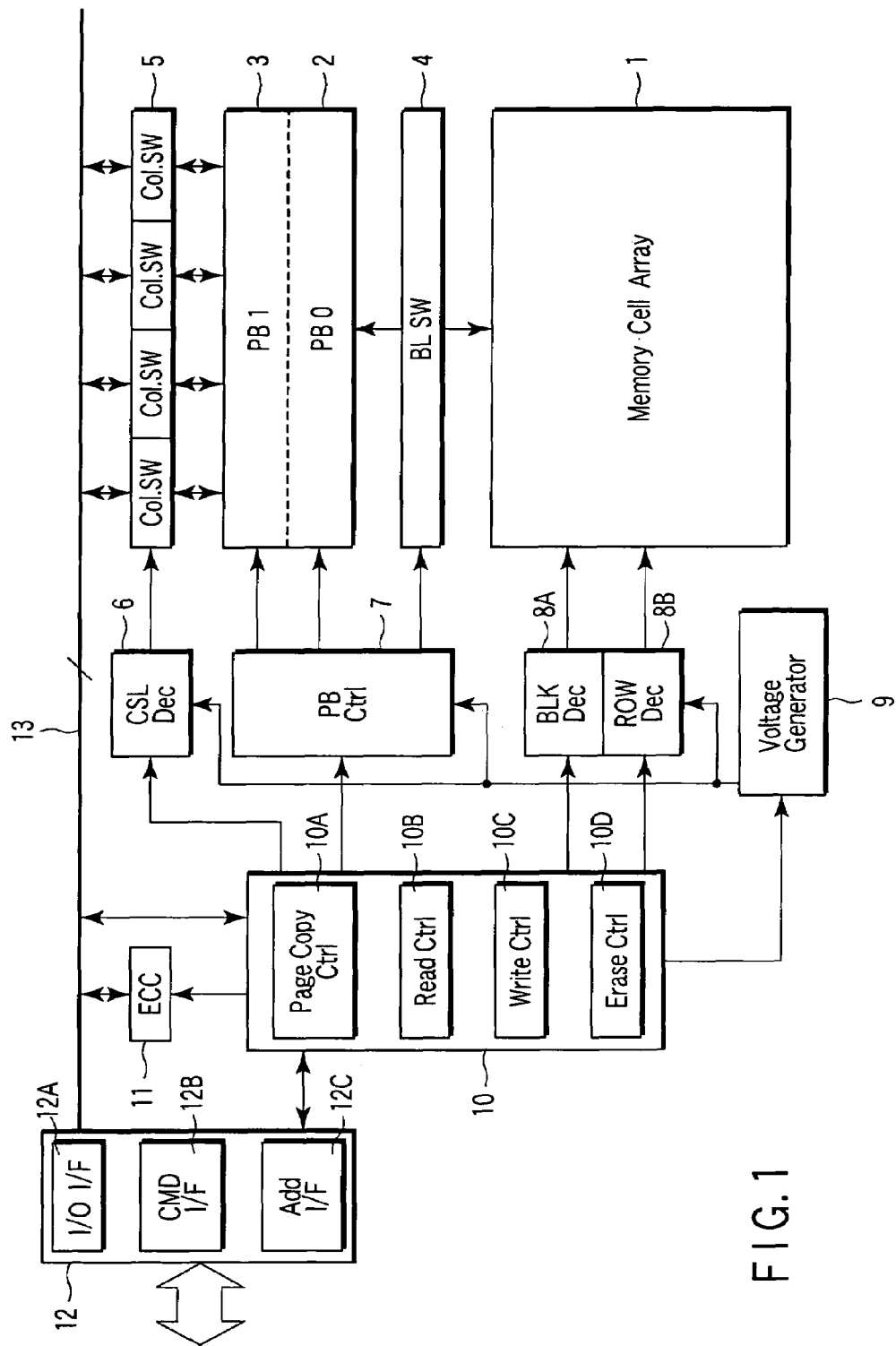
FIG. 1 is a block diagram showing the schematic arrangement of a NAND flash memory in order to explain a memory system according to the first embodiment of the present invention.

FIG. 1 is a block diagram showing the schematic arrangement of a NAND flash memory in order to explain a memory system and data copy method therefor according to the first embodiment of the present invention.

In a memory cell array 1, NAND strings are arrayed. The memory cell array 1 is connected to first and second page buffers (PB0 and PB1) 2 and 3 via a bit line switch (BL SW) 4. The first page buffer 2 comprises a functional unit serving as a sense amplifier and a functional unit serving as a data cache. The data cache holds sense data in read and write data in write. The page buffer 2 is so configured as to exchange data of each page with the second page buffer (PB1) 3. The page buffers 2 and 3 have a function of allowing their data to be copied to each other and swapping their data.

The page buffer 3 can input/output data by connecting a column designated by a CSL decoder (CSL Dec) 6 to an I/O bus 13 via a column switch (Col. SW) 5. When the bit width of the I/O bus 13 is, e.g., 8 bits, the page buffer 3 exchanges data of each byte with the I/O bus 13.

The I/O bus 13 is connected to an error correction (ECC) circuit 11. The error correction circuit 11 performs generation of an error correction code and error correction calculation.

Data transfer between the memory cell array 1 and the data holding portions of the page buffers 2 and 3, and sense operation of the page buffer 2 are controlled by a page buffer control circuit (PB Ctrl) 7. The page buffer control circuit 7 also controls operation of the bit line switch 4.

A memory cell designated by a page address in the memory cell array 1 is selected by a block decoder (BLK Dec) 8A and row decoder (ROW Dec) 8B. A voltage applied to memory cells in the memory cell array 1 and the page buffers 2 and 3 is generated by a voltage generator 9. A voltage generated by the voltage generator 9 is applied to the CSL decoder 6, page buffer control circuit 7, block decoder 8A, row decoder 8B, and the like.

The semiconductor memory device (module) is externally connected via an interface circuit 12. The interface circuit 12 incorporates circuit units 12A, 12B, and 12C for data input/output (I/O I/F), command (CMD I/F), and address (Add I/F). Various instructions such as read and write, addresses, and data are exchanged via the interface circuit 12. Addresses and instructions input via the interface circuit 12 are sent to an internal controller 10. The internal controller 10 comprises circuit units 10A, 10B, 10C, and 10D for performing various control operations such as page copy control (Page Copy Ctrl), read control (Read Ctrl), write control (Write Ctrl), and erase control (Erase Ctrl). The internal controller 10 controls write/read operation, erase operation, sense operation, and the like by controlling the voltage generator 9, decoders 8A and 8B, page buffer control circuit 7, and CSL decoder 6.

Figure 2:
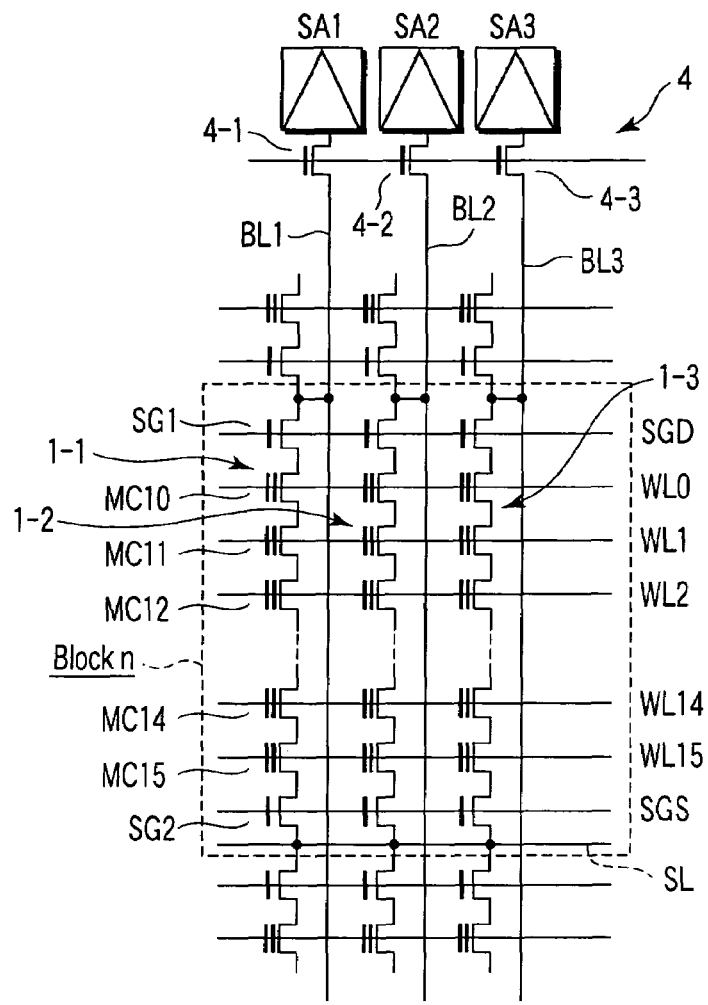
FIG. 2 is a circuit diagram showing an example of the arrangement of a memory cell array in the circuit shown in FIG. 1.

The memory cell array 1 is a NAND cell array in which NAND strings 1-1, 1-2, 1-3, . . . are arrayed, as shown in FIG. 2. On each of the NAND strings 1-1, 1-2, 1-3, . . . , memory cells MC10, MC11, MC12, . . . , MC14, and MC15 of an n-channel MOSFET structure in which a floating gate and control gate are stacked are series-connected to each other so adjacent memory cells share sources and drains. A first select gate SG1 is interposed between one terminal of the NAND string and a bit line BL1, whereas a second select gate SG2 is interposed between the other terminal and a source line SL. The control gates of memory cells MC on the same rows are commonly connected to word lines WL0 to WL15. The gates of the first select gates on the same row are commonly connected to a first select gate line SGD, and those of the second select gates on the same row are commonly connected to a second select gate line SGS. The NAND strings on the same columns are connected to same bit lines BL1, BL2, BL3, . . . via the first select gates SG1.

The NAND strings 1-1, 1-2, 1-3, . . . are commonly connected to a source line SL via the corresponding second select gates SG2.

The bit lines BL1, BL2, BL3, . . . are connected to circuit units SA1, SA2, SA3, . . . functioning as sense amplifiers in the page buffer 2 via the current paths of MOSFETs 4-1, 4-2, 4-3, . . . functioning as the bit line switch 4.

Figure 3:
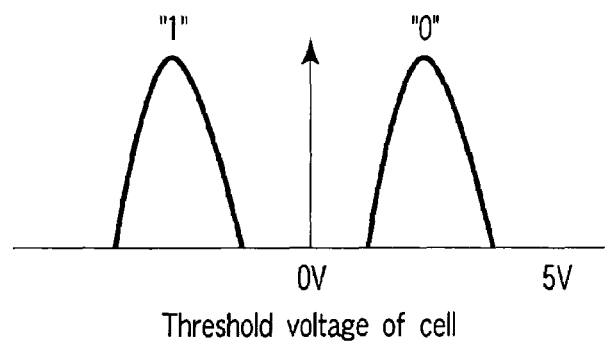
FIG. 3 is a graph for explaining the relationship between memory data and the distribution of the threshold voltage of a cell transistor for binary storage.

Data is stored by changing the threshold voltage depending on whether to inject electrons into the floating gate of the memory cell (cell transistor) MC. For example, for binary storage, data is stored by making the negative and positive states of the threshold voltage of the cell transistor MC correspond to "1" and "0", respectively, as shown in FIG. 3.

Figure 4A:
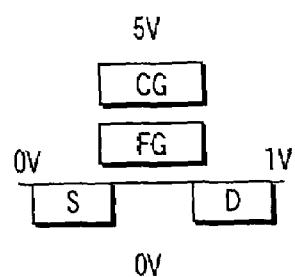
FIG. 4A is a schematic sectional view showing an example of the bias in each operation of the flash memory and showing the application of the bias voltage to a cell transistor in data read.
Figure 4B:
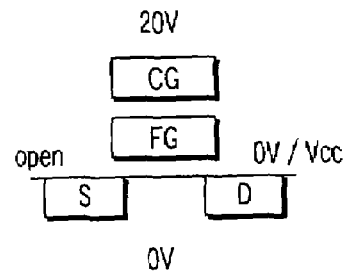
FIG. 4B is a schematic sectional view showing another example of the bias in each operation of the flash memory and showing the application of the bias voltage to the cell transistor in data write.
Figure 4C:
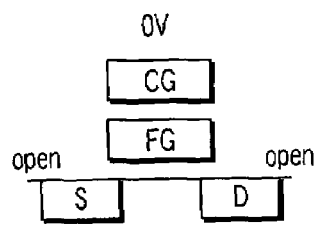
FIG. 4C is a schematic sectional view showing the application of the bias voltage to the cell transistor in data erase.

FIGS. 4A, 4B, and 4C show examples of the bias in respective operations of the flash memory. In data read, as shown in FIG. 4A, 0V is applied to a source S of the cell transistor MC; 1V, to a drain D; and 5V, to a control gate CG. At this time, the channel region (back gate) is set to 0V. In data write, as shown in FIG. 4B, the source S of the cell transistor is opened, 0V or Vcc is applied to the drain D in accordance with write data, 20V is applied to the control gate CG, and 0V is applied to the channel region. In erase, as shown in FIG. 4C, both the source S and drain D of the cell transistor are opened, 0V is applied to the control gate CG, and 20V is applied to the channel region.

Figure 5:
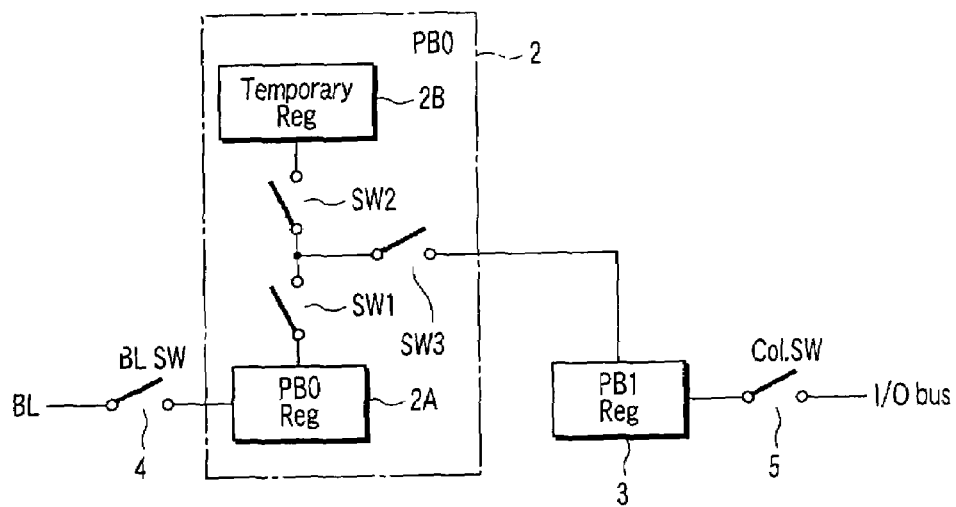
FIG. 5 is a block diagram showing a schematic arrangement for implementing the data swap function of a page buffer in the circuit shown in FIG. 1.

FIG. 5 is a block diagram showing a schematic arrangement for implementing the data swap function of the page buffers 2 and 3 in the circuit shown in FIG. 1. The page buffer 2 incorporates a register (PB0 Reg) 2A which statically holds data in the page buffer 2, and a temporary register (Temporary Reg) 2B which dynamically holds data by using a capacitive element or the like. This circuit implements the data swap function by selectively switching switches SW1 to SW3. Data are swapped by temporarily saving data of either the page buffer 2 or 3 in the temporary register 2B under the control of the page buffer control circuit 7, copying data between the page buffers 2 and 3, and finally writing back data in the temporary register 2B.

Figure 6:
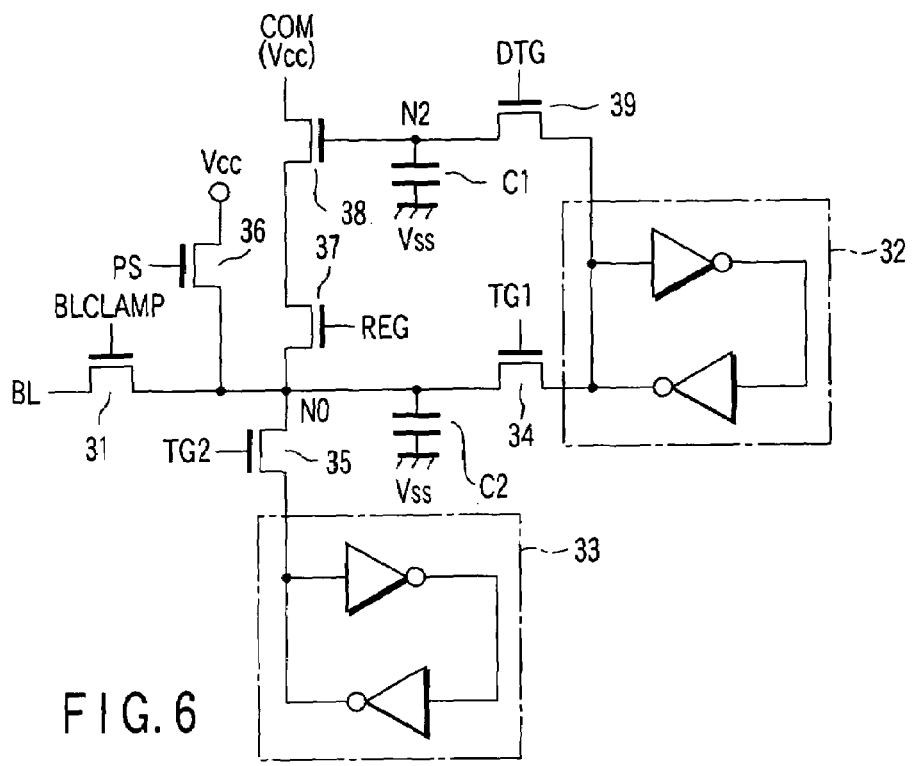
FIG. 6 is a circuit diagram showing a concrete example of the arrangement of the page buffer and its peripheral circuit in the circuit shown in FIG. 5.
Figure 7:
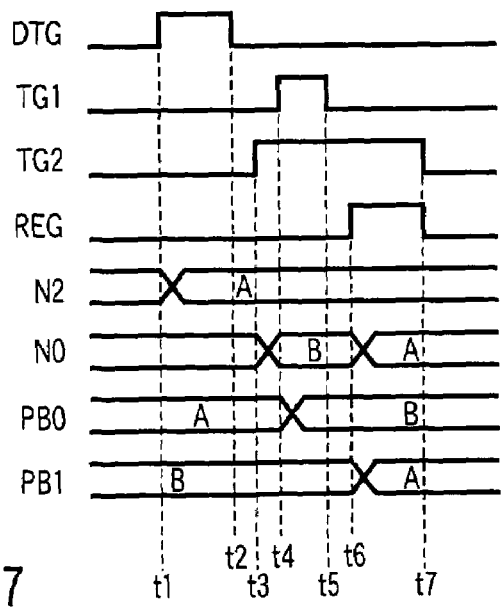
FIG. 7 is a timing chart showing operation of the circuit shown in FIG. 6.

FIG. 6 is a circuit diagram showing a concrete example of the arrangement of the page buffers 2 and 3 and their peripheral circuit in the circuit shown in FIG. 5. FIG. 7 is a timing chart showing operation of the circuit shown in FIG. 6. The circuit shown in FIG. 6 comprises an n-channel MOSFET 31 for setting the potential of the bit line, latches 32 and 33 serving as a sense amplifier and data cache, transfer n-channel MOSFETs 34 and 35 for transferring the potential of the bit line BL to the latches 32 and 33, an n-channel MOSFET 36 for precharging the bit line, n-channel MOSFETs 37 to 39 for reading out and transferring data held in the latches 32 and 33, and capacitors C1 and C2 for holding charges.

The bit line BL is connected to one end of the current path of the MOSFET 31, and the other end (node N0) of the current path of the MOSFET 31 is connected to one end of each of the current paths of the MOSFETs 34 and 35. The gate of the MOSFET 31 receives a signal BLCLAMP, that of the MOSFET 34 receives a signal TG1, and that of the MOSFET 35 receives a signal TG2. The other end of the current path of the MOSFET 34 is connected to the latch 32, whereas the other end of the current path of the MOSFET 35 is connected to the latch 33.

The current path of the MOSFET 36 is connected between the node N0 and a power supply Vcc. The gate of the MOSFET 36 receives a signal PS. To precharge the bit line BL, the signal PS is made high to turn on the MOSFET 36. At this time, the ON resistance of the MOSFET 31 is changed in accordance with the level of the signal BLCLAMP to adjust the precharge potential of the bit line BL. The capacitor C2 is connected between the node N0 and ground Vss. The node N0 is connected to one end of the current path of the MOSFET 37, and the gate of the MOSFET 37 receives a signal REG. The other end of the current path of the MOSFET 37 is connected to one end of the current path of the MOSFET 38, and the gate (node N2) of the MOSFET 38 is connected to one end of the current path of the MOSFET 39. The other end (comparison line COM for verify) of the current path of the MOSFET 38 is shared for each byte. The capacitor C1 is connected between the node N2 and the ground Vss. The capacitors C2 and C1 need not always be arranged if the parasitic capacitances of the nodes N0 and N2 are large enough. The other end of the current path of the MOSFET 39 is connected to the node between the MOSFET 34 and the latch 32, and the gate of the MOSFET 39 receives a signal DTG.

In this arrangement, data read from a selected memory cell via the bit line BL is supplied to the latch 32 or 33 via the MOSFETs 31 and 34 or the MOSFETs 31 and 35, sensed, and held. Data swap between the latches 32 and 33 is done as represented by the timing chart of FIG. 7. Assume that the latch 32 latches data A and the latch 33 latches data B.

When the signal DTG goes high during a period from time t1 to time t2, the MOSFET 39 is turned on, and the node N2 sets its level in accordance with data A of the latch 32. That is, the node N2 (capacitance node) functions as the temporary register 2B in the circuit shown in FIG. 5, and can temporarily hold data of the latch 32 by turning on and then off the MOSFET 39.

At time t3, the signal TG2 goes high, the MOSFET 35 is turned on, and the node N0 sets its level in accordance with data B of the latch 33. At time t4, the signal TG1 goes high, the MOSFET 34 is turned on, and the potential of the node N0 is supplied to the latch 32 and latched. At time t5, the signal TG1 goes low, the MOSFET 34 is turned off, and the latched state is held. Accordingly, data B of the latch 33 is written in the latch 32.

At time t6, the signal REG goes high, the MOSFET 37 is turned on, and the level of the node N0 is determined in accordance with the on/off state of the MOSFET 38 that corresponds to the level of the node N2. At this time, the comparison line COM is charged to the power supply voltage Vcc, and the node N0 is charged, making it high, when the node N2 is high but is not charged when the node N2 is low. In other words, data A of the latch 32 is transferred to the node N0. Since the MOSFET 35 is on, data A of the node N0 is supplied to the latch 33 and latched. At time t7, the signals TG2 and REG go low, the MOSFETs 35 and 37 are turned off, and the latched state is held. In this way, swap between data of the latch 32 and data A and B of the latch 33 is completed.

Operation of the arrangement as shown in FIGS. 1 to 7 will be explained with reference to a copy sequence for a plurality of pages shown in the flowchart of FIG. 8 and the timings of pipeline operation shown in the schematic timing chart of FIG. 9.

A case wherein a plurality of pages in a given block are to be copied to another block in the erase state will be exemplified.

In this case, four pieces of information are determined at the start of copying:
 (a) copy source block address S_BA
 (b) copy destination block address D_BA
 (c) copy start page address S_PA
 (d) copy end page address E_PA When the copy sequence starts, address variables are determined. Read and write addresses PAGE_RD and PAGE_WR and an address count-up variable "page" (page=S_PA) are initialized as shown in step S1. A copy start address designated by the copy start page address S_PA is set as a read target.

Then, read is executed (step S2). Read starts by supplying a read command or trigger by using the read page address PAGE_RD set in step S1 as an access address Flash_PAGE to the memory cell array 1. After read is completed (step S3), data are swapped between the page buffers 2 and 3 (step S4). Data swap in step S4 is done in accordance with, e.g., procedures as shown in the timing chart of FIG. 7. The page buffer 2 saves data of the read page address PAGE_RD that is read in steps S2 and S3, while the page buffer 3 holds insignificant data in step S4.

ECC calculation starts for the data read in step S2 (step S5). Data held in the page buffer 3 are sequentially sent to the ECC circuit 11 via the I/O bus 13 (byte by byte for a bus width of 8 bits). The ECC circuit 11 verifies whether the data includes an error, and if an error is detected, corrects it. Only data to be corrected (or the entire data including that data) is written back in the page buffer 3. This sequence will be called ECC calculation.

After ECC calculation starts in step S5, the next address to be accessed is calculated (step S6). The write block address is the copy destination block D_BA, and the page address is PAGE_RD designated in step S1. The next read address is obtained by adding 1 to PAGE_RD in step S1. These calculations can be expressed by equations in step S6 using the variable "page".

After ECC calculation ends (step S7), it is determined whether the current page is the last page of page copy (step S9). The flowchart waits for memory ready (step S7), and the status is checked (step S8). In the first sequence, no data is written, and the flow passes these steps. These steps aim at pipeline operation and will be described later. The memory is already ready for processes after step S3 in which read is completed, and in step S7, only the end of ECC calculation is checked and the flow passes through the remaining process. Since the default value of the status exhibits the pass state, the sequence of step S8 passes through the pass flow.

If it is determined in step S9 that the current page is the last page, i.e., no page to be read exists, the process moves to a flow on the Yes side to write data of the page buffer 3 having undergone ECC calculation in the page buffer 3→page buffer 2→memory cell; otherwise, to step S10 on the No side.

In step S10, read of the next page starts. If read in step S10 ends (step S11), the page buffer 3 holds data which has undergone ECC calculation and is to be written in the copy destination, and the page buffer 2 holds page data which is next to the page held in the page buffer 3 and does not undergo ECC calculation yet. Data of the page buffers 2 and 3 are swapped (step S12), write of data having undergone ECC calculation in the copy destination block starts (step S13), and ECC calculation of the next page starts (step S5). That is, write and ECC calculation are simultaneously executed.

While write and ECC calculation are executed, the next page address to be accessed is calculated (step S6), and the flow waits for the completion of write and ECC calculation (step S7). Write in the flash memory is accompanied with verify, a status representing whether write normally ends is sent back at the end of write, and the write status is checked.

If write fails, page copy abnormally ends; if write passes, the flow advances to the next sequence (step S8).

If a page to be read remains in the copy source after write passes, the flow advances to step S10 to repeat the same operation. If no page remains, the page buffer 2 holds, in step S9, insignificant data in the flash memory serving as the copy destination after write, and the page buffer 3 holds the last page data having undergone ECC calculation. In step S14, the data in the page buffer 3 is moved to the page buffer 2, and in steps S15 to S17, the data is written and the status is checked. If write fails, page copy abnormally ends; if write passes, page copy normally ends and is completed.

Figure 9:
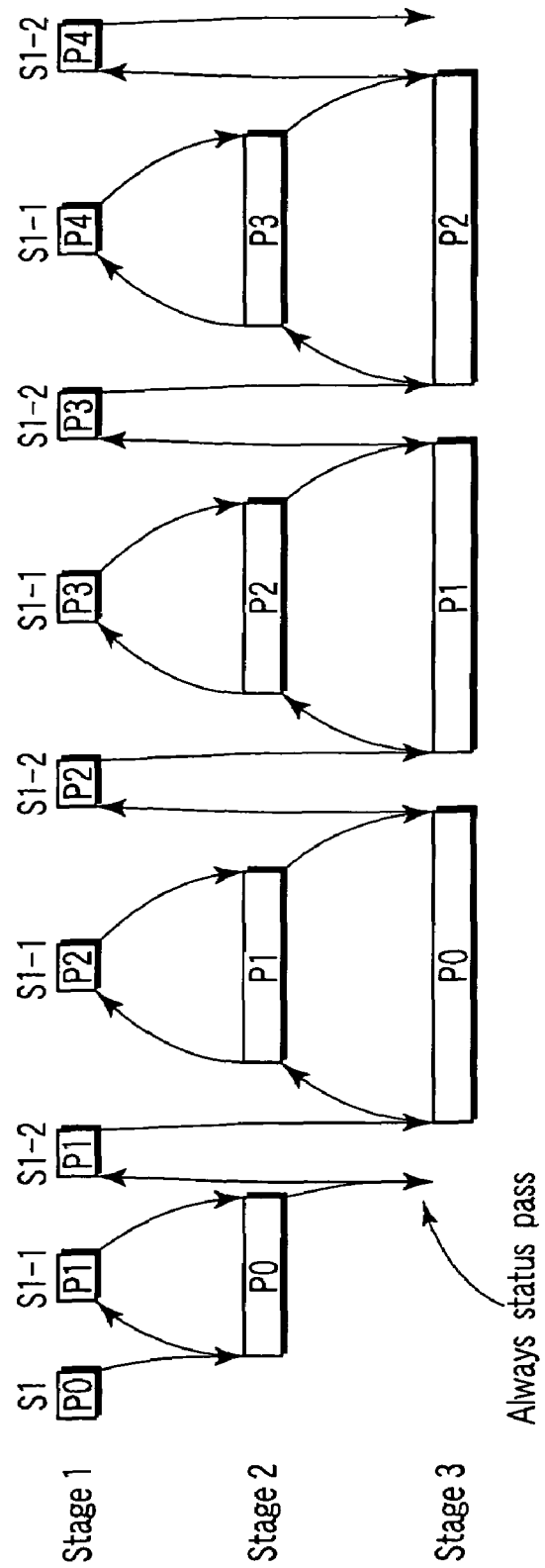
FIG. 9 is a timing chart schematically showing timings at which four, read, address calculation, ECC calculation, and write sequences are simultaneously executed as one box in order to explain the data copy method of the memory system according to the first embodiment of the present invention.

FIG. 9 schematically shows timings at which the four, read, address calculation, ECC calculation, and write sequences according to the first embodiment are simultaneously executed as one box. P0, P1, P2, P3, P4, . . . in the box represent page numbers.

The pages P0, P1, P2, P3, P4, . . . are processed in the order of Stage 1-1 (address calculation), Stage 1-2 (read), Stage 2 (ECC calculation), and Stage 3 (write), and the four processes of the same page do not overlap. Address calculation and read are alternately executed for each of pages P0, P1, P2, P3, P4, . . . . During address calculation, ECC calculation of page data one page before and write of page data two pages before are simultaneously executed.

The total processing time of page copy can be greatly shortened by simultaneously executing processes on Stage 1-1, Stage 2, and Stage 3, especially ECC calculation on Stage 2 and write on Stage 3.

According to the above arrangement and method, cache memories capable of holding page data of two pages are prepared. While one cache memory accesses a memory cell, the other cache memory accesses the error correction circuit. For example, when a given page is written, error correction of the next copy data can be performed. This can greatly shorten the copy processing time of a plurality of pages.

The first embodiment can therefore provide a memory system and data copy method therefor that can shorten the copy processing time of a plurality of pages while ensuring the data reliability.

SECOND EMBODIMENT

Figure 10:
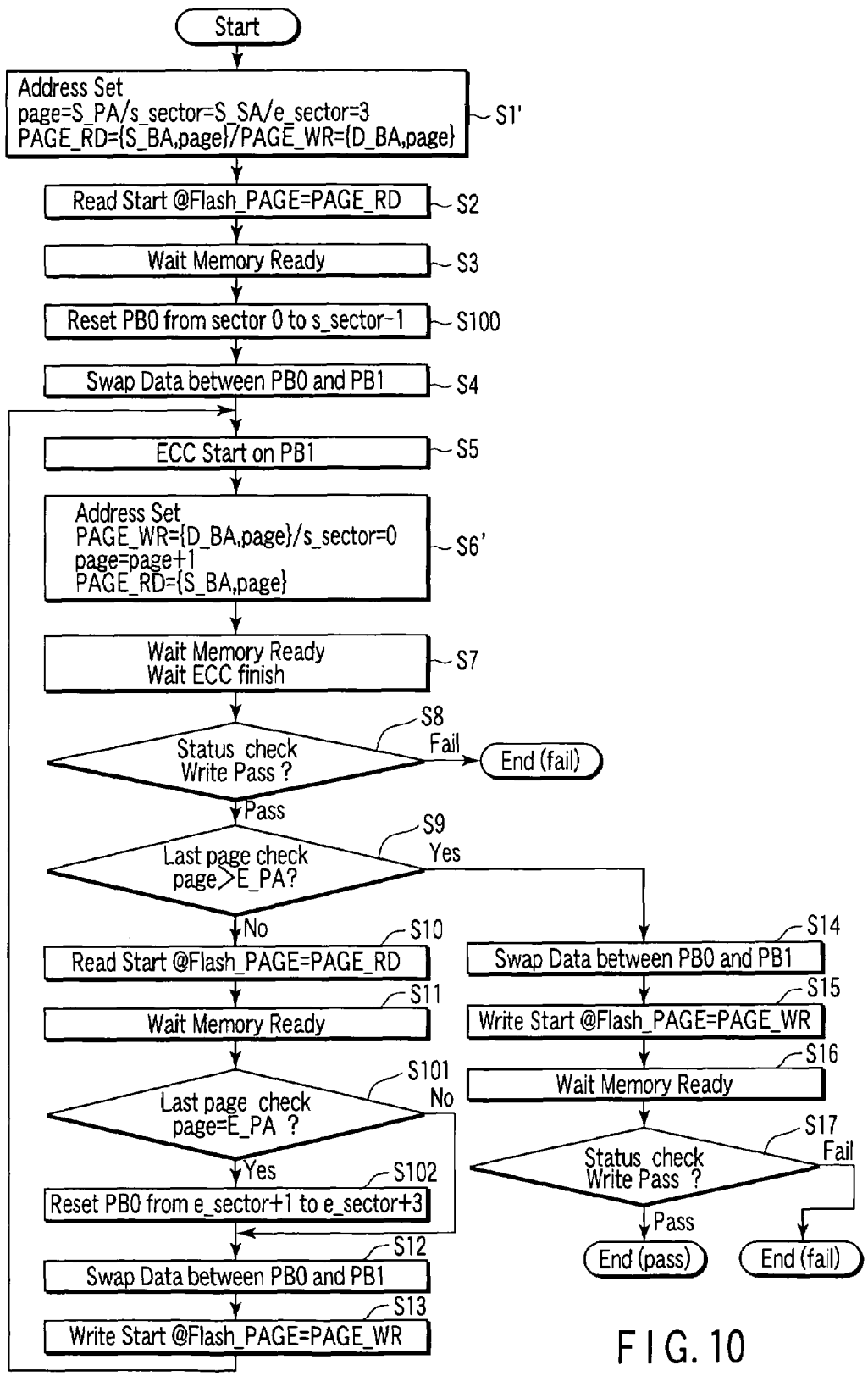
FIG. 10 is a flowchart showing a data copy method for a NAND flash memory in order to explain a memory system and data copy method therefor according to the second embodiment of the present invention.

FIG. 10 is a flowchart showing a data copy method for a NAND flash memory in order to explain a memory system and data copy method therefor according to the second embodiment of the present invention. The second embodiment is directed to a case wherein copying is executed for each sector and the start and end positions of page copy are set in intermediate sectors.

A NAND flash memory generally reads and writes each page. In some cases, the start and end of page copy may be set not at the start of a page but midway in a page because the size of one page is large. For example, when the page size is 2 KB+64 B (64 B represents an area of an ECC code and management data) and the unit of data to be accessed is 512 B+16 B (to be referred to as a sector hereinafter), one page is made up of four sectors. The start of page copy may be the first page or the second (or third or fourth) sector, and the end of page copy may be the first (or second or third) sector.

In order to implement page copy of each sector, a page buffer 2 in the circuit shown in FIG. 1 is provided with a sector reset function. "Reset" means a function of changing all data of a target sector in the page buffer 2 to "1"s.

Assume that one page is formed from four sectors, the first sector corresponds to address "0", the second sector corresponds to address "1", the third sector corresponds to address "2", and the fourth sector corresponds to address "3".

Similar to the first embodiment, a case wherein a plurality of pages in a given page are copied to another block in the erase state will be exemplified.

In this case, pieces of information are determined at the start of copying:
(a) copy source block address S_BA
(b) copy destination block address D_BA
(c) copy start page address S_PA
(d) copy start sector address S_SA
(e) copy end page address E_PA
(f) copy end sector address E_SA The basic copy procedures are the same as those in the first embodiment shown in the flowchart of FIG. 8 except that after read, sector 0 to sector S_SA−1 are reset at the start of page copy and sector E_SA+1 to sector E_SA+3 at the end of page copy.

More specifically, when the copy sequence starts, address variables are determined. The read and write addresses PAGE_RD and PAGE_WR and the address count-up variable "page" (page=S_PA/s_sector=S_SA/e_sector=3) are initialized as shown in step S1'. A copy start address designated by the copy start page address S_PA and copy start sector address S_SA is set as a read target.

Then, read is executed (step S2). Read starts by supplying a read command or trigger by using the read page address PAGE_RD set in step S1' as the access address Flash_PAGE to a memory cell array 1. After read is completed (step S3), sector 0 to sector S_SA−1 in the page buffer 2 are reset at the start of page copy (step S100), and data are swapped between the page buffer 2 and a page buffer 3 (step S4). Data swap in step S4 is done in accordance with, e.g., procedures as shown in the timing chart of FIG. 7. The page buffer 2 saves data of the read page address PAGE_RD that is read in steps S2 and S3 (at the start of page copy, sector 0 to sector S_SA−1 in the page buffer 2 are reset), while the page buffer 3 holds insignificant data in step S4.

ECC calculation starts for the data read in step S2 (step S5). Data held in the page buffer 3 are sequentially sent to an ECC circuit 11 via an I/O bus 13 (byte by byte for a bus width of 8 bits). The ECC circuit 11 verifies whether the data includes an error, and if an error is detected, corrects it. Only data to be corrected (or the entire data including that data) is written back in the page buffer 3.

After ECC calculation starts in step S5, the next address to be accessed is calculated (step S6'). The write block address is the copy destination block D_BA, and the page address is PAGE_RD designated in step S1. The next read address is obtained by adding 1 to PAGE_RD in step S1. These calculations can be expressed by equations in step S6' using the variable "page".

After ECC calculation ends (step S7), it is determined whether the current page is the last page of page copy (step S9). The flowchart waits memory ready (step S7), and the status is checked (step S8). In the first sequence, no data is written, and the flow passes these steps. These steps aim at pipeline operation. The memory is already ready for processes after step S3 in which read is completed, and in step S7, only the end of ECC calculation is checked and the flow passes through the remaining process. Since the default value of the status exhibits the pass state, the sequence of step S8 passes through the pass flow.

If it is determined in step S9 that the current page is the last page, i.e., no page to be read exists, the process moves to a flow on the Yes side to write data of the page buffer 3 having undergone ECC calculation in the page buffer 3→page buffer 2→memory cell; otherwise, to step S10 on the No side.

In step S10, read of the next page starts. If read in step S10 ends (step S11), it is determined whether the position of page copy is the end of page copy (step S101). If Yes in step S101, sector E_SA+1 to sector E_SA+3 are reset (step S102). The page buffer 3 holds data which has undergone ECC calculation and is to be written in the copy destination, and the page buffer 2 holds page data which is next to the page held in the page buffer 3 and does not undergo ECC calculation yet. Data of the page buffers 2 and 3 are swapped (step S12), write of data having undergone ECC calculation in the copy destination block starts (step S13), and ECC calculation of the next page starts (step S5). That is, write and ECC calculation are simultaneously executed.

While write and ECC calculation are executed, the next page address to be accessed is calculated (step S6'), and the flow waits for the completion of write and ECC calculation (step S7). Write in the flash memory is accompanied with verify, a status representing whether write normally ends is sent back at the end of write, and the write status is checked. If write fails, page copy abnormally ends; if write passes, the flow advances to the next sequence (step S8).

If a page to be read remains in the copy source after write passes, the flow advances to step S10 to repeat the same operation. If no page remains, the page buffer 2 holds, in step S9, insignificant data in the flash memory serving as the copy destination after write, and the page buffer 3 holds the last page data having undergone ECC calculation. In step S14, the data in the page buffer 3 is moved to the page buffer 2, and in steps S15 to S17, the data is written and the status is checked. If write fails, page copy abnormally ends; if write passes, page copy normally ends and is completed.

According to the above arrangement and method, cache memories capable of holding page data of two pages are prepared. While one cache memory accesses a memory cell, the other cache memory accesses the error correction circuit. For example, when a given page is written sector by sector, error correction of the next copy data can be performed. The page buffer 2 has the sector reset function, and a case wherein the start and end positions of page copy are set in intermediate sectors can be dealt with. This can greatly shorten the copy processing time of a plurality of pages.

The second embodiment can provide a memory system and data copy method therefor that can shorten the copy processing time of a plurality of pages while ensuring data reliability.

THIRD EMBODIMENT

Figure 11:
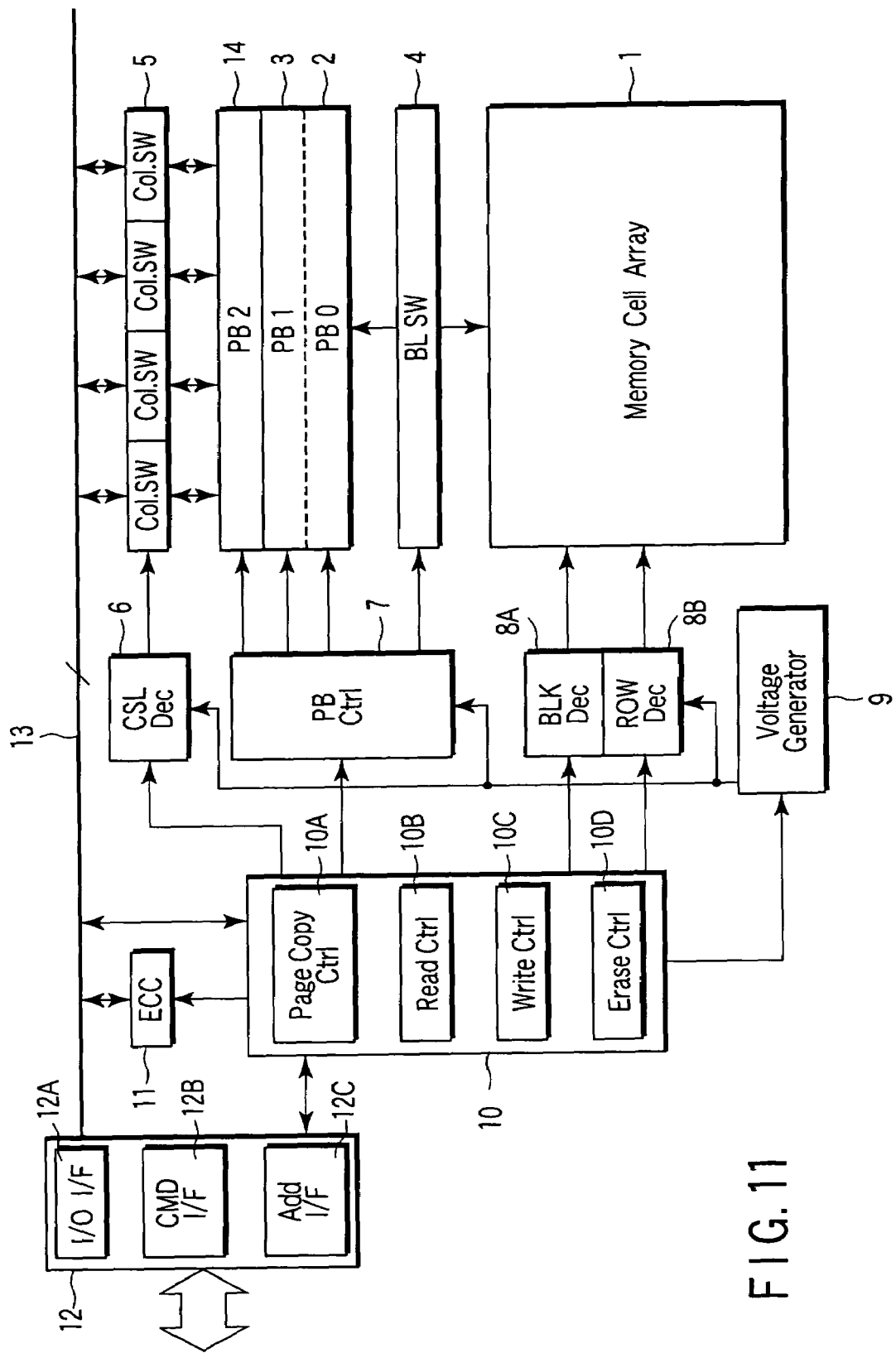
FIG. 11 is a block diagram showing the schematic arrangement of a NAND flash memory in order to explain a memory system according to the third embodiment of the present invention.
Figure 12:
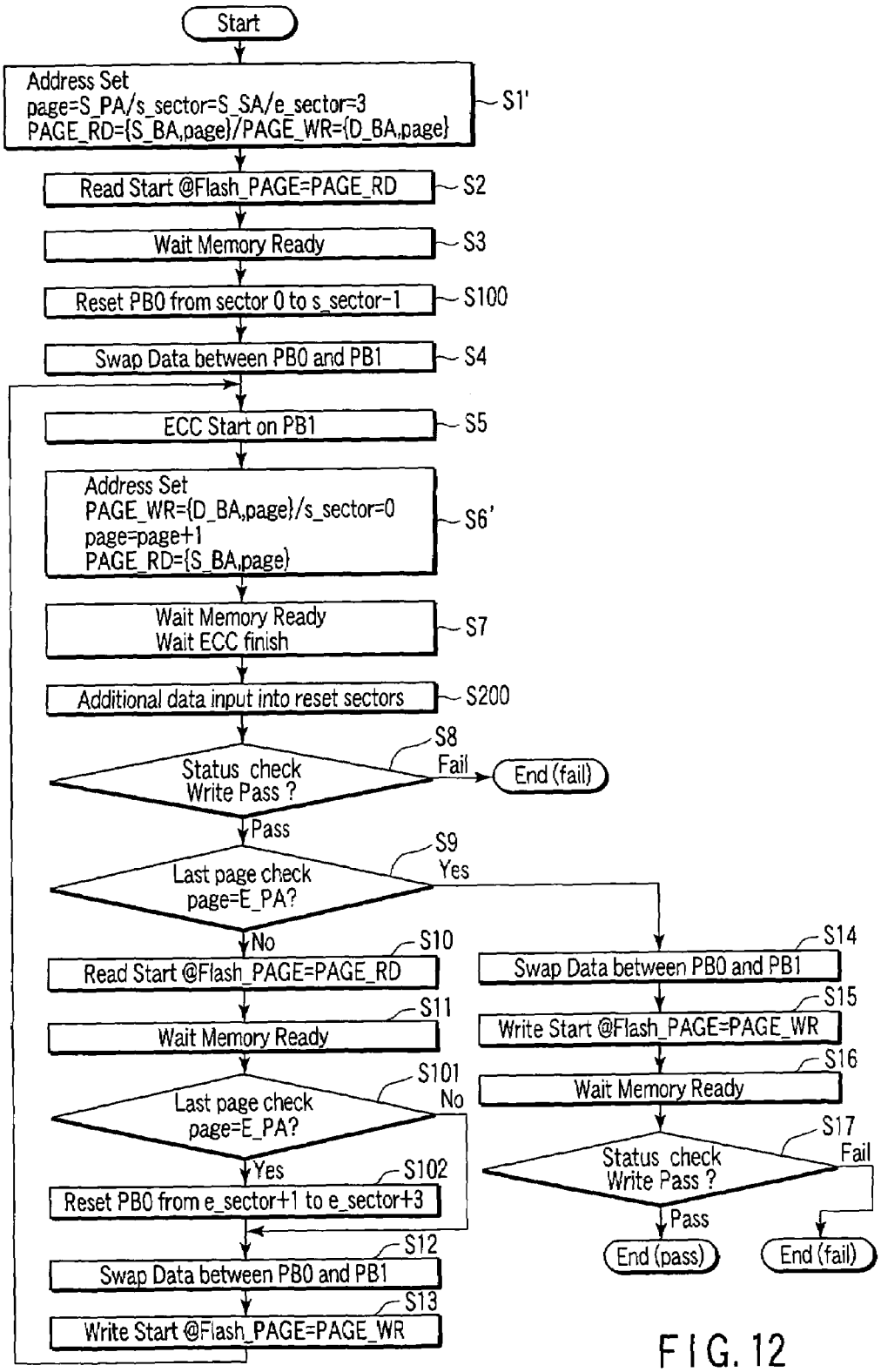
FIG. 12 is a flowchart showing a copy sequence for a plurality of pages in order to explain the data copy method of the memory system according to the third embodiment of the present invention.

FIGS. 11 and 12 are views for explaining a memory system and data copy method therefor according to the third embodiment of the present invention. FIG. 11 is a block diagram showing the schematic arrangement of a NAND flash memory. FIG. 12 is a flowchart showing a copy sequence for a plurality of pages. Similar to the second embodiment, the third embodiment is directed to a case wherein copying is executed for each sector and reset sector data is externally complemented.

In the second embodiment, one page must be divided into sectors and repetitively rewritten by the sector. In this operation, the same word line is selected and written a plurality of times (equal to the number of sectors). The write stress (disturbance) is applied to the first written sector by "number of sectors −1" times, and the reliability of the memory cell degrades. Thus, write is desirably performed by the page. However, to perform data management of each sector by only write of each page, a data-reset sector in the second embodiment must be externally complemented with data.

The third embodiment implements data complementation. A third page buffer (PB2) 14 is interposed between a column switch 5 and a page buffer 3, and new data is received from an I/O bus 13 via the column switch 5. Write is executed by complementing a sector reset after ECC calculation with data from the page buffer 14.

More specifically, when the copy sequence starts, address variables are determined. The read and write addresses PAGE_RD and PAGE_WR and the address count-up variable "page" (page=S_PA/s_sector=S_SA/e_sector=3) are initialized as shown in step S11. A copy start address designated by the copy start page address S_PA and copy start sector address S_SA is set as a read target.

Then, read is executed (step S2). Read starts by supplying a read command or trigger by using the read page address PAGE_RD set in step S1' as the access address Flash_PAGE to a memory cell array 1. After read is completed (step S3), sector 0 to sector S_SA−1 in a page buffer 2 are reset if the position of page copy is the start of page copy (step S100), and data are swapped between the page buffers 2 and 3 (step S4). Data swap in step S4 is done in accordance with, e.g., procedures as shown in the timing chart of FIG. 7. The page buffer 2 saves data of the read page address PAGE_RD that is read in steps S2 and S3 (at the start of page copy, sector 0 to sector S_SA−1 in the page buffer 2 are reset), while the page buffer 3 holds insignificant data in step S4.

ECC calculation starts for the data read in step S2 (step S5). Data held in the page buffer 3 are sequentially sent to an ECC circuit 11 via the I/O bus 13 (byte by byte for a bus width of 8 bits). The ECC circuit 11 verifies whether the data includes an error, and if an error is detected, corrects it. Only data to be corrected (or the entire data including that data) is written back in the page buffer 3.

After ECC calculation starts in step S5, the next address to be accessed is calculated (step S6'). The write block address is the copy destination block D_BA, and the page address is PAGE_RD designated in step S1. The next read address is obtained by adding 1 to PAGE_RD in step S1. These calculations can be expressed by equations in step S6' using the variable "page".

After ECC calculation ends (step S7), the sector reset after ECC calculation is complemented with data from the page buffer 14 (step S200), and it is determined whether the current page is the last page of page copy (step S9). The flowchart waits memory ready (step S7), and the status is checked (step S8). In the first sequence, no data is written, and the flow passes these steps. These steps aim at pipeline operation. The memory is already ready for processes after step S3 in which read is completed, and in step S7, only the end of ECC calculation is checked and the flow passes through the remaining process. Since the default value of the status exhibits the pass state, the sequence of step S8 passes through the pass flow.

If it is determined in step S9 that the current page is the last page, i.e., no page to be read exists, the process moves to a flow on the Yes side to write data of the page buffer 3 having undergone ECC calculation in the page buffer 3→page buffer 2→memory cell; otherwise, to step S10 on the No side.

In step S10, read of the next page starts. If read in step S10 ends (step S11), it is determined whether the position of page copy is the end of page copy (step S101). If Yes in step S101, sector E_SA+1 to sector E_SA+3 are reset (step S102). The page buffer 3 holds data which has undergone ECC calculation and is to be written in the copy destination, and the page buffer 2 holds page data which is next to the page held in the page buffer 3 and does not undergo ECC calculation yet. Data of the page buffers 2 and 3 are swapped (step S12), write of data having undergone ECC calculation in the copy destination block starts (step S13), and ECC calculation of the next page starts (step S5). That is, write and ECC calculation are simultaneously executed.

While write and ECC calculation are executed, the next page address to be accessed is calculated (step S6'), and the flow waits for the completion of write and ECC calculation (step S7). Write in the flash memory is accompanied with verify, a status representing whether write normally ends is sent back at the end of write, and the write status is checked. If write fails, page copy abnormally ends; if write passes, the flow advances to the next sequence (step S8).

If a page to be read remains in the copy source after write passes, the flow advances to step S10 to repeat the same operation. If no page remains, the page buffer 2 holds, in step S9, insignificant data in the flash memory serving as the copy destination after write, and the page buffer 3 holds the last page data having undergone ECC calculation. In step S14, the data in the page buffer 3 is moved to the page buffer 2, and in steps S15 to S17, the data is written and the status is checked. If write fails, page copy abnormally ends; if write passes, page copy normally ends and is completed.

According to the above arrangement and method, cache memories capable of holding page data of two pages are prepared. While one cache memory accesses a memory cell, the other cache memory accesses the error correction circuit. For example, when a given page is written sector by sector, error correction of the next copy data can be performed. This can greatly shorten the copy processing time of a plurality of pages. Since write is executed after a sector reset after ECC calculation is complemented with new data, data management of each sector can be achieved by only write of each page, suppressing disturbance and ensuring reliability.

As a result, the third embodiment can provide a memory system and data copy method therefor that can shorten the copy processing time of a plurality of pages while ensuring data reliability.

FOURTH EMBODIMENT

Figure 13:
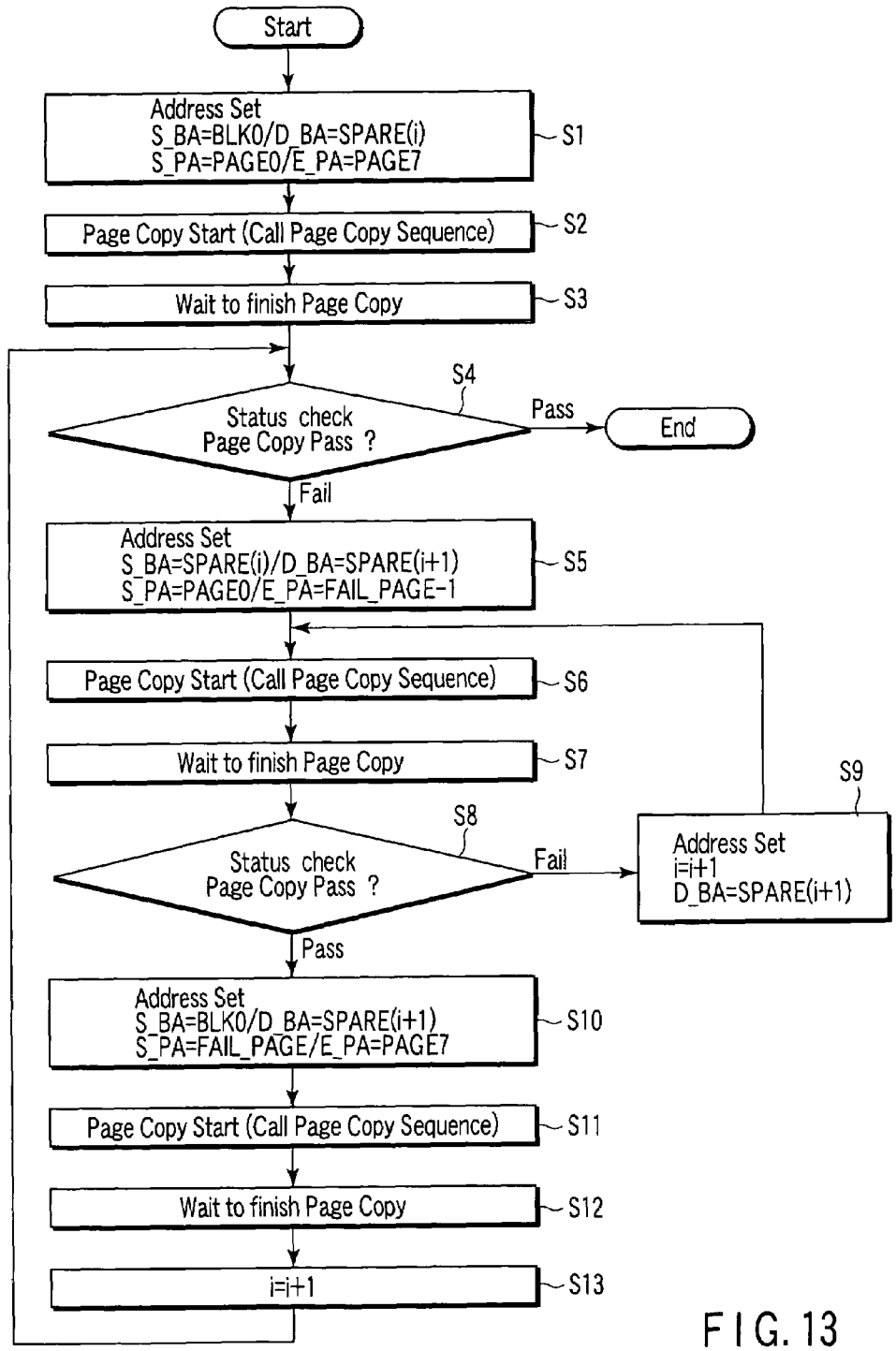
FIG. 13 is a flowchart showing process procedures upon program fail in a NAND flash memory in order to explain a memory system and data copy method therefor according to the fourth embodiment of the present invention.

FIG. 13 is a flowchart showing process procedures upon program fail in a NAND flash memory in order to explain a memory system and data copy method therefor according to the fourth embodiment of the present invention. FIG. 13 shows a process sequence upon page copy fail that is based on the flowchart of the page copy method shown in FIG. 8 according to the first embodiment.

In the fourth embodiment, no ECC process is executed in page copy read for fail recovery.

Write in a flash memory may be accompanied with fail. Details of operation will be explained in a fail process of page copy that calls the page copy flow as a consequence.

Page copy, which is an original purpose, starts. The block address (BLK0) of the copy source and the range of pages (e.g., PAGE0 to PAGE 7) to be copied are designated. The copy destination block must be a block in which all data are "1"s after erase, and a group of erased blocks is represented by SPARE(i).

After the address is determined (step S1), page copy starts (step S2), and the flow waits for the completion of page copy (step S3). At this time, page copy described in the first embodiment is performed. Upon the completion of page copy, whether copy operation passes/fails is checked (step S4). If page copy passes, all pages are normally written in desired page copy, and page copy normally ends.

If page copy fails and ends, this means that write of any page fails. In the page copy sequence, a page address at which write fails is sent back as information together with the pass/fail status upon fail. This information is expressed by FAIL_PAGE in FIG. 13.

If page copy fails, a new copy destination block SPARE (i+1) is designated, and page copy is executed again. As the simplest method, the copy destination block is set as a new erase block while the copy source block is kept at BLK0. In the fourth embodiment, however, pages up to FAIL_PAGE−1 is copied from the copy destination block of page copy in step S3 to a new copy destination block (steps S5 to S9), and pages from FAIL_PAGE are copied from the original copy source block BLK0 (steps S10 to S13→step S4).

At this time, ECC calculation may be skipped in page copy of step S6. This is because PAGE0 to FAIL_PAGE−1 have normally undergone error correction and write in page copy of step S3, and no data modification by disturbance occurs at high possibility immediately after write.

Pages from FAIL_PAGE are subjected to read from the original copy source block BLK0→error correction and correction→write in accordance with the normal procedures.

Figure 8:
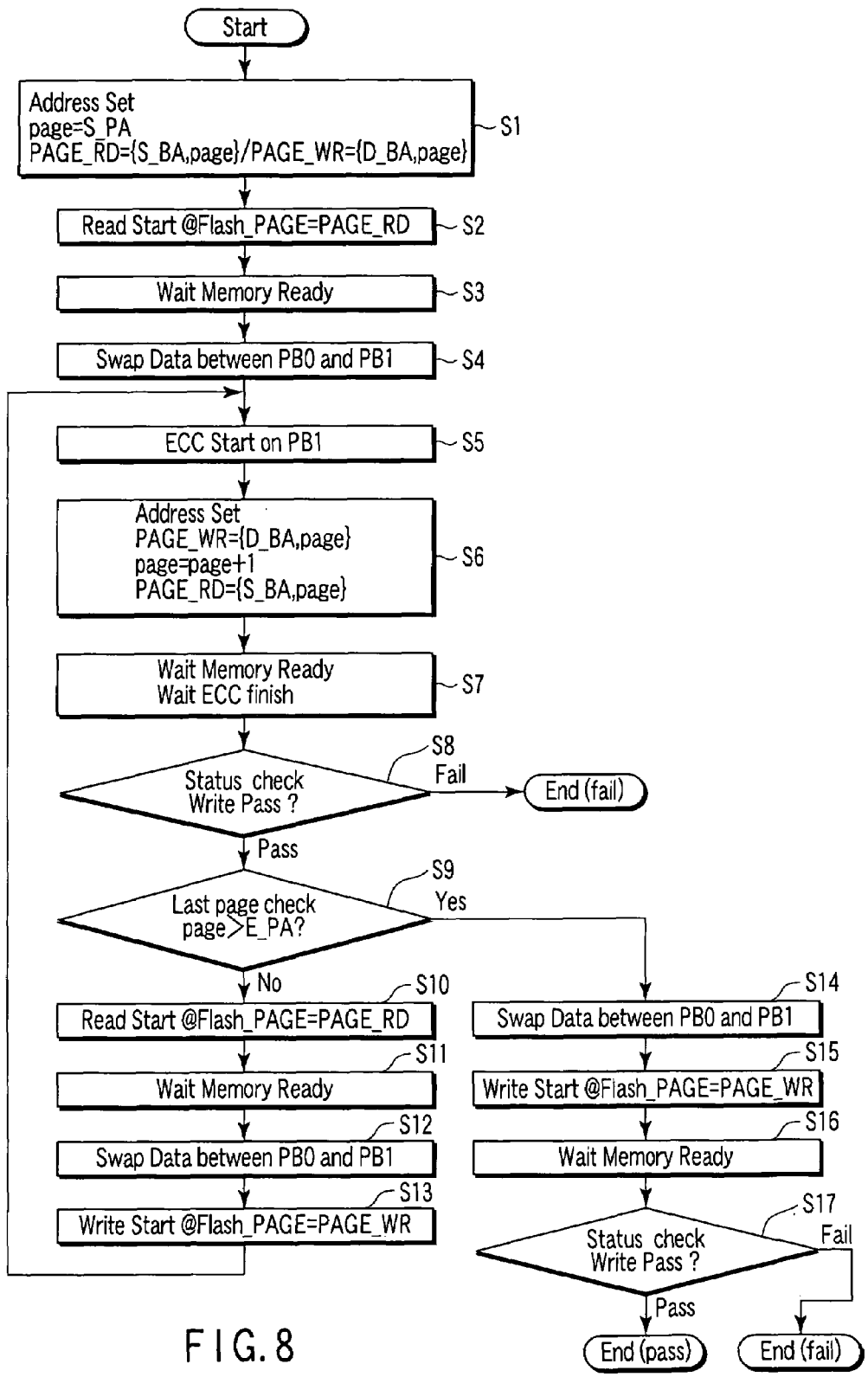
FIG. 8 is a flowchart showing a copy sequence for a plurality of pages in order to explain the data copy method of the memory system according to the first embodiment of the present invention.

The flowchart shown in FIG. 13 has exemplified a process sequence upon page copy fail that is based on the flowchart of FIG. 8 according to the first embodiment. The same process is also possible for the second or third embodiment.

According to the above arrangement and method, similar to the first to third embodiments, the fourth embodiment can provide a memory system and data copy method therefor that can shorten the copy processing time of a plurality of pages while ensuring the data reliability.

Since no ECC process is done in page copy read for fail recovery, the copy processing time of a plurality of pages can be further shortened.

The copy sequence may be externally controlled by externally inputting a page copy command, copy source block address, copy start page address, and copy destination block address.

FIFTH EMBODIMENT

Figure 14:
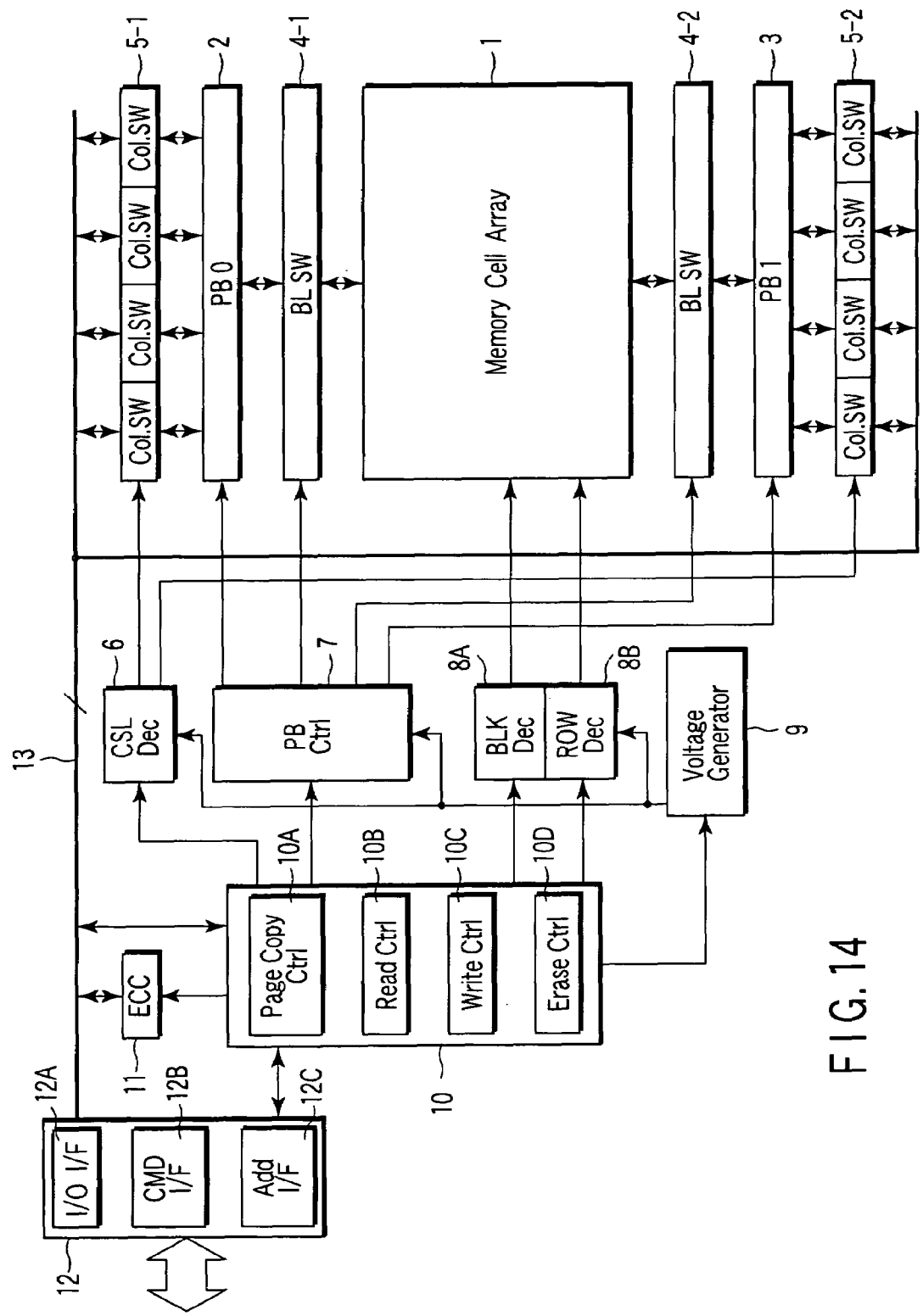
FIG. 14 is a block diagram showing the schematic arrangement of a NAND flash memory in order to explain a memory system according to the fifth embodiment of the present invention.

FIG. 14 is a block diagram showing the schematic arrangement of a NAND flash memory in order to explain a memory system and data copy method therefor according to the fifth embodiment of the present invention.

In the circuit shown in FIG. 14, bit line switches 4-1 and 4-2, first and second page buffers 2 and 3, and column switches 5-1 and 5-2 are respectively arranged on the two sides of a memory cell array 1. The column switches 5-1 and 5-2 are connected to an I/O bus 13. Both the page buffers 2 and 3 have a sense amplifier function. The page buffers 2 and 3 each functioning as "sense amplifier+buffer" are connected to a bit line BL of the memory cell array 1 via the bit line switches 4-1 and 4-2, and to the I/O bus 13 via the column switches 5-1 and 5-2.

A page buffer control circuit 7 and CSL decoder 6 control the bit line switches 4-1 and 4-2, first and second page buffers 2 and 3, and column switches 5-1 and 5-2. When one page buffer is connected to the bit line BL, the other page buffer is connected to the I/O bus 13. Under this control, pipeline operation as shown in FIG. 9 can be implemented.

The remaining basic circuit is the same as the circuit shown in FIG. 1, the same reference numerals denote the same parts, and detailed description thereof will be omitted.

Figure 15:
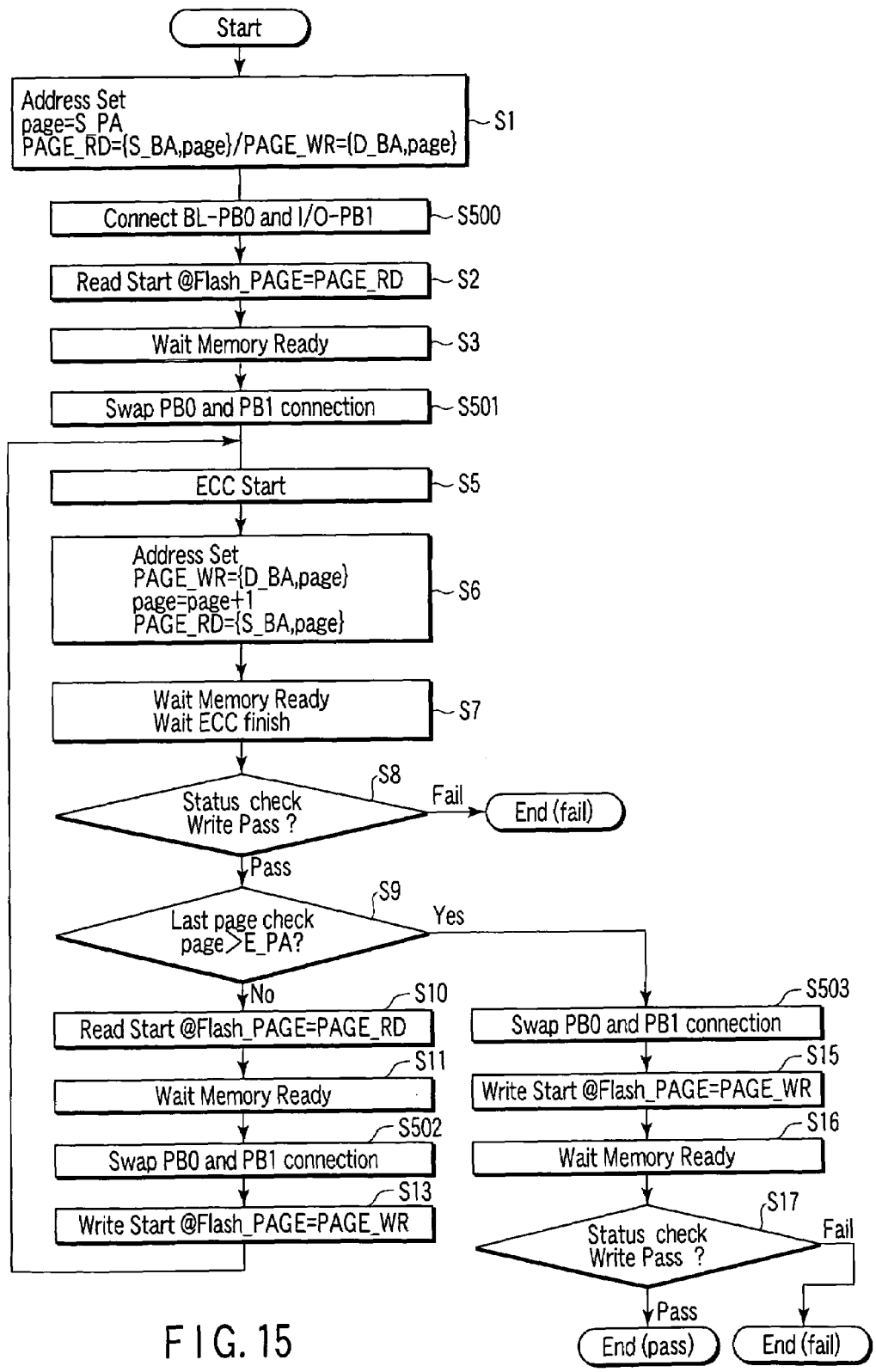
FIG. 15 is a flowchart showing a copy sequence for a plurality of pages in order to explain the data copy method of the memory system according to the fifth embodiment of the present invention.

FIG. 15 is a flowchart showing a page copy method in the NAND flash memory shown in FIG. 14. The fifth embodiment achieves the same operation as that of the circuit shown in FIGS. 5 and 6 not by swapping data between the page buffers 2 and 3 as in the first embodiment, but by inverting the connection between the page buffers 2 and 3 and the bit line BL and I/O bus 13.

More specifically, when the copy sequence starts, address variables are determined. The read and write addresses PAGE_RD and PAGE_WR and the address count-up variable "page" (page=S_PA) are initialized as shown in step S1. A copy start address designated by the copy start page address S_PA is set as a read target.

The page buffer 2 is connected to the bit line BL of the memory cell array 1 via the bit line switch 4-1, and at the same time the page buffer 3 is connected to the I/O bus 13 via the column switch 5-2 (step S500).

After that, read is executed (step S2). Read starts by supplying a read command or trigger by using the read page address PAGE_RD set in step S1 as the access address Flash_PAGE to the memory cell array 1. Data of the read page address PAGE_RD is read from the memory cell array 1 to the page buffer 2 and held. At this time, insignificant data is input from the I/O bus 13 to the page buffer 3 via the column switch 5-2 and held. After read is completed (step S3), the page buffer 2 is connected to the I/O bus 13 via the column switch 5-1, and the page buffer 3 is connected to the bit line of the memory cell array 1 via the bit line switch 4-2 (step S501).

ECC calculation starts for the data read to the page buffer 2 in step S501 (step S5). Data held in the page buffer 2 are sequentially sent to the ECC circuit 11 via the I/O bus 13 (byte by byte for a bus width of 8 bits). The ECC circuit 11 verifies whether the data includes an error, and if an error is detected, corrects it. Only data to be corrected (or the entire data including that data) is written back in the page buffer 2.

After ECC calculation starts in step S5, the next address to be accessed is calculated (step S6). The write block address is the copy destination block D_BA, and the page address is PAGE_RD designated in step S1. The next read address is obtained by adding 1 to PAGE_RD in step S1. These calculations can be expressed by equations in step S6 using the variable "page".

After ECC calculation ends (step S7), it is determined whether the current page is the last page of page copy (step S9). The flowchart waits for memory ready (step S7), and the status is checked (step S8). In the first sequence, no data is written, and the flow passes these steps. These steps aim at pipeline operation. The memory is already ready for processes after step S3 in which read is completed, and in step S7, only the end of ECC calculation is checked and the flow passes through the remaining process. Since the default value of the status exhibits the pass state, the sequence of step S8 passes through the pass flow.

If it is determined in step S9 that the current page is the last page, i.e., no page to be read exists, the process moves to a flow on the Yes side to write data having undergone ECC calculation from the page buffer 2 to the memory cell; otherwise, to step S10 on the No side.

In step S10, read of the next page starts. If read in step S10 ends (step S11), the page buffer 2 holds data which has undergone ECC calculation and is to be written in the copy destination, and the page buffer 3 holds the next page data which does not undergo ECC calculation yet. Hence, the page buffer 3 is connected to the I/O bus 13 via the column switch 5-2, and the page buffer 2 is connected to the bit line of the memory cell array 1 via the bit line switch 4-1 (step S502). Write of data having undergone ECC calculation from the page buffer 2 to the copy destination block of the memory cell array 1 starts (step S13). The flow returns to step S5 to start ECC calculation of the next page data read to the page buffer 3. That is, write and ECC calculation are simultaneously executed.

While write and ECC calculation are executed, the next page address to be accessed is calculated (step S6), and the flow waits for the completion of write and ECC calculation (step S7). Write in the flash memory is accompanied with verify, a status representing whether write normally ends is sent back at the end of write, and the write status is checked. If write fails, page copy abnormally ends; if write passes, the flow advances to the next sequence (step S8).

If a page to be read remains in the copy source after write passes, the flow advances to step S10 to repeat the same operation. If no page remains, the page buffer 2 holds, in step S9, insignificant data in the flash memory serving as the copy destination after write, and the page buffer 3 holds the last page data having undergone ECC calculation. In step S503, the page buffer 2 is connected to the I/O bus 13 via the column switch 5-1, and the page buffer 3 is connected to the bit line of the memory cell array 1 via the bit line switch 4-2. In steps S15 to S17, the data is written and the status is checked. If write fails, page copy abnormally ends; if write passes, page copy normally ends and is completed.

According to the above arrangement and method, cache memories capable of holding page data of two pages are prepared. While one cache memory accesses a memory cell, the other cache memory accesses the error correction circuit. For example, when a given page is written, error correction of the next copy data can be performed. This can greatly shorten the copy processing time of a plurality of pages.

Consequently, the fifth embodiment can provide a memory system and data copy method therefor that can shorten the copy processing time of a plurality of pages while ensuring data reliability.

Figure 16:
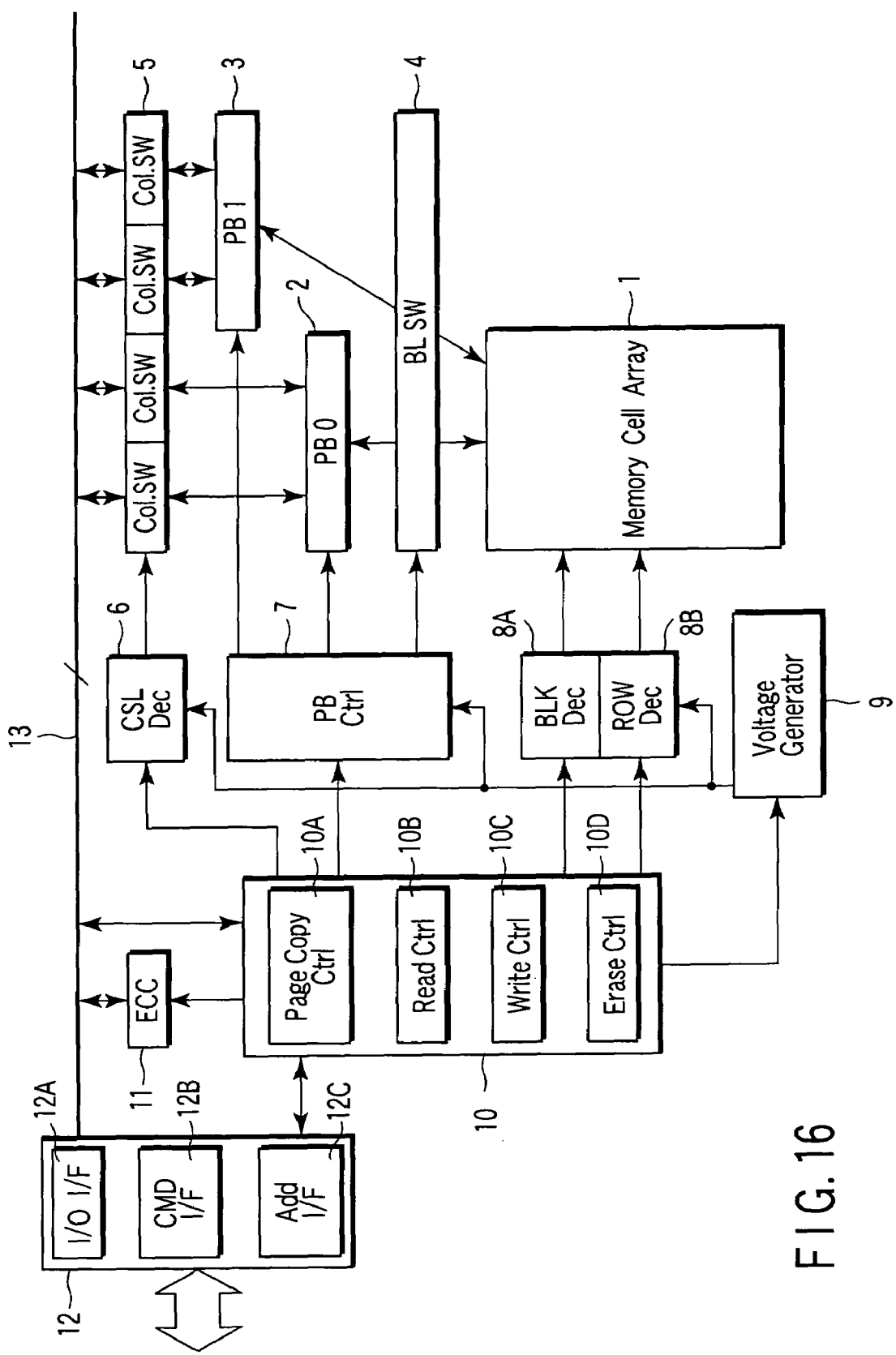
FIG. 16 is a block diagram showing the schematic arrangement of a NAND flash memory in order to explain a modification of the memory system according to the fifth embodiment of the present invention.

In the circuit shown in FIG. 14, the bit line switches 4-1 and 4-2, first and second page buffers 2 and 3, and column switches 5-1 and 5-2 are respectively arranged on the two sides of the memory cell array 1. Alternatively, as shown in FIG. 16, the bit line switch, first and second page buffers 2 and 3, and column switch 5 may be arranged on one side of the memory cell array 1 as far as no problem occurs in the pattern layout.

Even with this pattern layout, substantially the same operation as page copy shown in FIG. 15 can be performed by switching and controlling the bit line switch 4 and column switch 5 to selectively switch the connection between the page buffers 2 and 3 and the memory cell array 1 and that between the page buffers 2 and 3 and the I/O bus 13.

SIXTH EMBODIMENT

Figure 17:
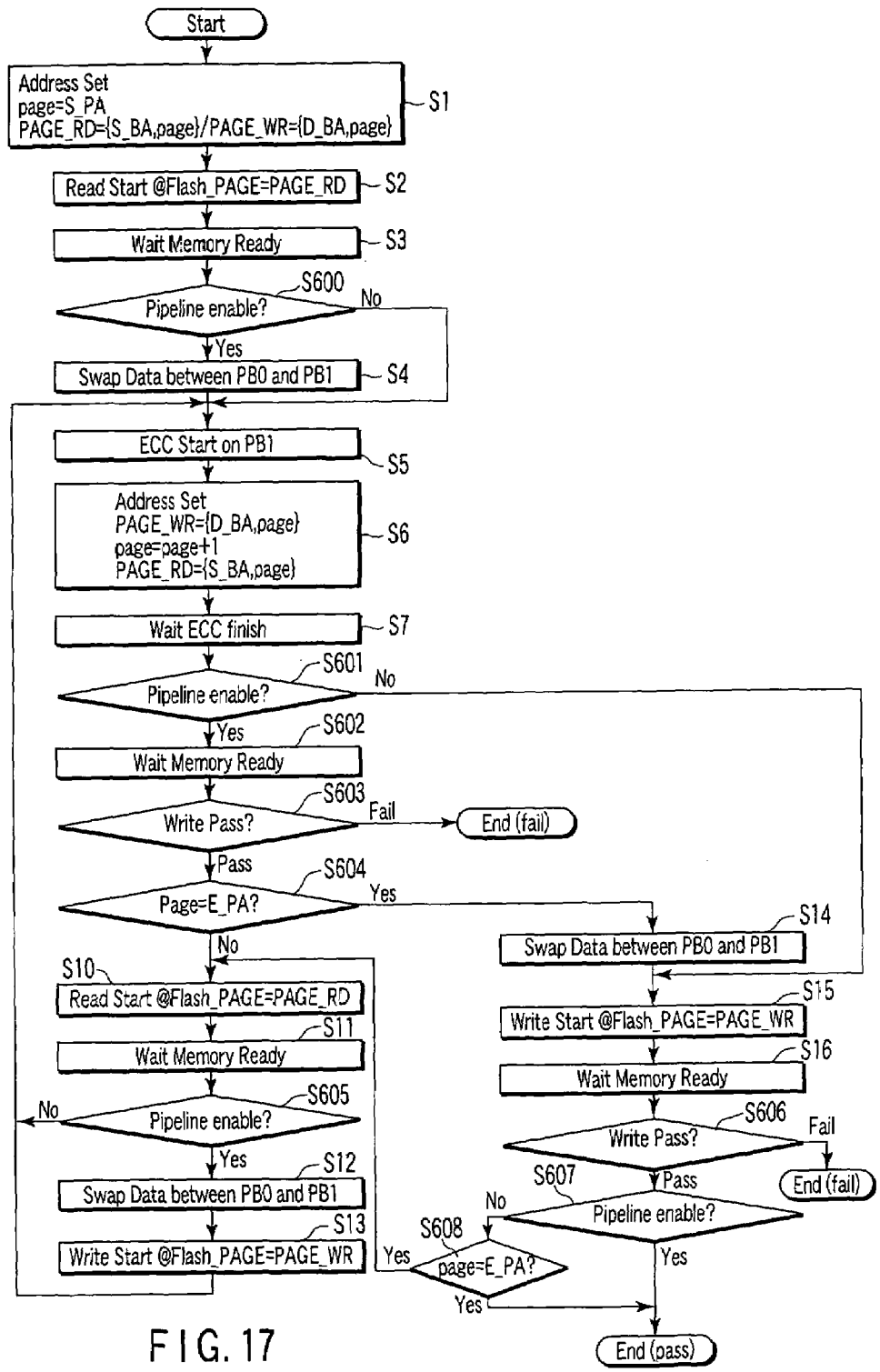
FIG. 17 is a flowchart showing a copy sequence for a plurality of pages in order to explain a memory system and data copy method therefor according to the sixth embodiment of the present invention.

FIG. 17 is a flowchart showing a page copy method in a NAND flash memory in order to explain a memory system and data copy method therefor according to the sixth embodiment of the present invention. According to the sixth embodiment, whether to perform a pipeline process can be switched.

In an arrangement having two page buffers, a pipeline is possible even in continuous write of externally receiving data. While write data is held in a page buffer 2 and written in a memory cell, write data of the next page is input to a page buffer 3, thereby shortening the write time.

If write fails during continuous write, data held in the page buffer 3 is not written in the memory cell yet. To execute page copy while holding data in the page buffer 3, conventional page copy must be done because page copy described in the first embodiment is impossible. For this reason, whether to execute a pipeline process must be switched.

FIG. 17 is a flowchart when the conventional page copy and page copy of the first embodiment can be switched by enabling/disabling the pipeline. By sharing some resources, the program size or the circuit scale for H/W control can be suppressed.

More specifically, when the copy sequence starts, address variables are determined. The read and write addresses PAGE_RD and PAGE_WR and the address count-up variable "page" (page=S_PA) are initialized as shown in step S1. A copy start address designated by the copy start page address S_PA is set as a read target.

Then, read is executed (step S2). Read starts by supplying a read command or trigger by using the read page address PAGE_RD set in step S1 as the access address Flash_PAGE to a memory cell array 1. After read is completed (step S3), it is determined whether to enable the pipeline process (step S600), and if the pipeline process is to be executed, data are swapped between the page buffers 2 and 3 (step S4). Data swap in step S4 is done in accordance with, e.g., procedures as shown in the timing chart of FIG. 7. The page buffer 2 saves data of the read page address PAGE_RD that is read in steps S2 and S3, while the page buffer 3 holds insignificant data in step S4.

If the pipeline process is determined in step S600 not to be performed, the ECC process in step S5 is done without executing data swap in step S4.

ECC calculation starts for the data read in step S2 (step S5). Data held in the page buffer 3 are sequentially sent to an ECC circuit 11 via an I/O bus 13 (byte by byte for a bus width of 8 bits). The ECC circuit 11 verifies whether the data includes an error, and if an error is detected, corrects it. Only data to be corrected (or the entire data including that data) is written back in the page buffer 3.

After ECC calculation starts in step S5, the next address to be accessed is calculated (step S6). The write block address is the copy destination block D_BA, and the page address is PAGE_RD designated in step S1. The next read address is obtained by adding 1 to PAGE_RD in step S1. These calculations can be expressed by equations in step S6 using the variable "page".

After ECC calculation ends (step S7), it is determined whether the pipeline process is enabled (step S601). If Yes in step S601, the flow waits for memory ready (step S602), and the status is checked (step S603). If the status check is determined to pass, it is determined whether the current page address is the copy end page address E_PA (step S604). If the status check is determined to fail, page copy abnormally ends. The flowchart waits for memory ready (step S602), and the status is checked (step S603). In the first sequence, no data is written, and the flow passes these steps. These steps aim at pipeline operation. The memory is already ready for processes after step S3 in which read is completed, and in step S7, only the end of ECC calculation is checked and the flow passes through the remaining process. Since the default value of the status exhibits the pass state, the sequence of step S603 passes through the pass flow.

If it is determined in step S604 that the current page is the last page, i.e., no page to be read exists, the process moves to a flow on the Yes side to write data of the page buffer 3 having undergone ECC calculation in the page buffer 3→page buffer 2→memory cell; otherwise, to step S10 on the No side.

In step S10, read of the next page starts. If read in step S10 ends (step S11), the page buffer 3 holds data which has undergone ECC calculation and is to be written in the copy destination, and the page buffer 2 holds page data which is next to the page held in the page buffer 3 and does not undergo ECC calculation yet. It is determined whether the pipeline process is enabled (step S605). If Yes in step S605, data of the page buffers 2 and 3 are swapped (step S12), write of data having undergone ECC calculation in the copy destination block starts (step S13), and ECC calculation of the next page starts (step S5). That is, write and ECC calculation are simultaneously executed.

If it is determined in step S605 that the pipeline process is not enabled, i.e., a normal process is to be performed, the flow returns to step S5 to start ECC calculation of the next page.

While write and ECC calculation are executed, the next page address to be accessed is calculated (step S6), and the flow waits for the completion of write and ECC calculation (step S7). It is determined again whether the pipeline process is enabled (step S601), and if Yes in step S601, the write status is checked (step S603). If write fails, page copy abnormally ends; if write passes, it is determined whether the current page is the last page (step S604).

If a page to be read remains in the copy source after write passes, the flow advances to step S10 to repeat the same operation. If no page remains, the page buffer 2 holds, in step S604, insignificant data in the flash memory serving as the copy destination after write, and the page buffer 3 holds the last page data having undergone ECC calculation. In step S14, the data in the page buffer 3 is moved to the page buffer 2, and in steps S15, S16, and S606, the data is written and the status is checked. If write fails in step S606, page copy abnormally ends; if write passes, it is determined whether the pipeline process is enabled (step S607). If Yes in step S607, page copy normally ends and is completed.

If it is determined step S607 that the pipeline process is not enabled, it is determined whether the current page address is the copy end page address E_PA (step S608). If Yes in step S608, the flow normally ends; if No in step S608, returns to step S10 to repeat the above-described operation until the current page address reaches the copy end page address or the flow abnormally ends.

According to the above method, when write fails during continuous write and data held in the page buffer 3 is not written in the memory cell yet, page copy cannot be executed while the page buffer 3 keeps holding the data. At this time, the pipeline process can be so switched as not to be performed, and thereby the copy processing time of a plurality of pages can be effectively shortened.

As has been described above, according to the memory system and data copy method therefor in the embodiments of the present invention, data reliability can be ensured by performing an error correction process in page copy of a plurality of pages in a NAND flash memory. The copy processing time can be greatly shortened by simultaneously executing error correction and read/write.

According to one aspect of the present invention, there can be provided a memory system and data copy method therefor that can greatly shorten the copy processing time of a plurality of pages while ensuring reliability.

In the above embodiments, circuits of a NAND flash memory are integrated into one chip. Alternatively, for example, the ECC circuit 11 may be arranged outside the chip and perform error correction calculation by exchanging data via the interface circuit 12 and I/O bus 13.

The present invention can also be applied to a system-on-chip (SOC), or a semiconductor device prepared by integrating a NAND flash memory and logic circuit into one chip.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A memory system comprising:
a memory cell array in which electrically rewritable nonvolatile memory cells are arrayed;
a first data buffer which holds, in read, data read from the memory cell array via a bit line switch and in write, data to be written in the memory cell array via the bit line switch;
a second data buffer which is configured to swap data with the first data buffer, copies data to the first data buffer, and receives a copy of data from the first data buffer;
a bus switch which is interposed between the second data buffer and a bus, selects part of data held by the second data buffer, and transfers the part of data to the bus;
an error correction circuit which is connected to the bus and performs error correction calculation of data read from the memory cell array; and
a control circuit which controls the bit line switch, the first data buffer, and the second data buffer, sequentially reads, page by page, at least one page from an mth (m is a positive integer) page to an nth (n is an integer greater than m) page of a first block in the memory cell array, controls the error correction circuit to perform error correction calculation by the error correction circuit, controls the first data buffer, the second data buffer, and the bit line switch, and controls to perform write in a second block in an erase state in the memory cell array.

2. A system according to claim 1, wherein the first data buffer has a functional unit serving as a sense amplifier and a functional unit serving as a data cache, and the functional unit serving as the data cache holds sense data in read and write data in write.

3. A system according to claim 1, wherein the first data buffer comprises a register which statically holds data, a temporary register which dynamically holds data, and a switch circuit which controls data transfer between the register and the temporary register, between the register and the second data buffer, and between the temporary register and the second data buffer.

4. A system according to claim 1, wherein the first data buffer exchanges data for each page with the second data buffer.

5. A system according to claim 1, wherein the first data buffer is divided into a plurality of areas, and data is reset for each sector.

6. A system according to claim 5, wherein reset of each sector is simultaneously executed for arbitrary sectors.

7. A system according to claim 5, further comprising a third data buffer which is interposed between the second data buffer and the bus switch and holds data for complementing data of a reset sector via the bus.

8. A system according to claim 1, wherein the control circuit controls verify operation of whether write is normally done upon read after write in the memory cell array, and when a verify result represents fail, outputs a status representing that page copy operation fails and a fail address.

9. A system according to claim 2, wherein the control circuit comprises a page buffer control circuit which controls the bit line switch, the first data buffer, and the second data buffer, and controls data transfer between the memory cell array, the first data buffer, and the second data buffer and sense operation of the functional unit serving as the sense amplifier in the first data buffer, and an internal controller which performs control for page copy, read, write, and erase.

10. A memory system comprising:
a memory cell array in which electrically rewritable nonvolatile memory cells are arrayed;
a first data buffer and a second data buffer which hold, in read, data read from the memory cell array and in write, data to be written in the memory cell array;
a bit line switch which connects one of the first data buffer and the second data buffer to the memory cell array;
a bus switch which connects, to a bus, one of the first data buffer and the second data buffer that is not connected to the memory cell array;
an error correction circuit which is connected to the bus and performs error correction calculation of data read from the memory cell array; and
a control circuit which controls the bit line switch, the first data buffer, and the second data buffer, sequentially reads, page by page, at least one page from an mth (m is a positive integer) page to an nth (n is an integer greater than m) page of a first block in the memory cell array, controls the error correction circuit to perform error correction calculation by the error correction circuit, controls the first data buffer, the second data buffer, and the bit line switch, and controls to perform write in a second block in an erase state in the memory cell array.

11. A system according to claim 10, wherein the bit line switch comprises a first bit line switch which is interposed between a bit line in the memory cell array and the first data buffer and controls data transfer between the memory cell array and the first data buffer under control of the control circuit, and a second bit line switch which is interposed between the bit line in the memory cell array and the second data buffer and controls data transfer between the memory cell array and the second data buffer under control of the control circuit.

12. A system according to claim 11, wherein the first data buffer is connected to the bit line of the memory cell array via the first bit line switch, and the second data buffer is connected to the bit line of the memory cell array via the second bit line switch.

13. A page copy method for a memory system, comprising:
reading, page by page, data of a plurality of pages at successive page addresses from a memory cell array to a first data buffer;
swapping data read to the first data buffer with data of a second data buffer;
executing error correction calculation for the readout data of said plurality of pages;
correcting erroneous data detected by the error correction calculation;
inputting, to the second data buffer, the data of said plurality of pages after correcting the erroneous data;

swapping the data of the second data buffer with the data of the first data buffer; and writing the data of the first data buffer in an area different from an area of the memory cell array from which the data is read, wherein error correction calculation and correction operation for a page next to a given page subjected to read or write is performed during read or write of the given page.

14. A method according to claim 13, wherein when page copy of copying an mth page (m is a positive integer) to an nth page (n is an integer greater than m) of a first block in the memory cell array to a second block normally ends up to a pth (p is an integer greater than m but less than n) page and fails at a qth (q is an integer greater than p) page, the mth page to the pth page are copied from the second block to a third block, and the qth page to the nth page are copied from the first block to the third block.

15. A method according to claim 14, wherein no error correction calculation and no error correction are performed when the mth page to the pth page are copied from the second block to the third block.

16. A data copy method for a memory system in which a plurality of pages are transferred and copied from a copy source block to a copy destination block in a flash memory having a memory cell array, a first page buffer, a second page buffer, and an error correction circuit, comprising:

storing first page data of the copy source block in the first page buffer;

storing second page data of the copy source block in the second page buffer;

starting a program procedure from the first page buffer and the second page buffer for the copy destination block of the memory cell array in order to program the first page data of the copy source block; and starting an ECC verify procedure in order to verify the second page data of the copy source block in the second page buffer, wherein the program procedure and the ECC verify procedure are simultaneously executed.

17. A method according to claim 16, which further comprises starting an address calculation procedure for a third page of the copy source block, and in which the address calculation procedure and the program procedure are simultaneously executed.

18. A method according to claim 16, which further comprises starting an address calculation procedure for a third page of the copy source block, and in which the address calculation procedure and the ECC verify procedure are simultaneously executed.

19. A method according to claim 16, further comprising swapping the first page data of the copy source block in the first page buffer and the second page data of the copy source block in the second page buffer.

* * * * *